United States Patent
Honda et al.

(10) Patent No.: US 7,960,293 B2
(45) Date of Patent: Jun. 14, 2011

(54) METHOD FOR FORMING INSULATING FILM AND METHOD FOR MANUFACTURING SEMICONDUCTOR DEVICE

(75) Inventors: Minoru Honda, Amagasaki (JP); Yoshihiro Sato, Amagasaki (JP); Toshio Nakanishi, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 201 days.

(21) Appl. No.: 12/302,810

(22) PCT Filed: May 30, 2007

(86) PCT No.: PCT/JP2007/060975
§ 371 (c)(1),
(2), (4) Date: Nov. 28, 2008

(87) PCT Pub. No.: WO2007/139141
PCT Pub. Date: Dec. 6, 2007

(65) Prior Publication Data
US 2009/0197403 A1    Aug. 6, 2009

(30) Foreign Application Priority Data

May 31, 2006   (JP) .................................. 2006-152783
Dec. 28, 2006  (JP) .................................. 2006-356083

(51) Int. Cl.
*H01L 21/31*   (2006.01)

(52) U.S. Cl. ........ 438/776; 438/769; 438/775; 438/778; 438/785; 438/792; 257/E21.268

(58) Field of Classification Search ........... 438/776
See application file for complete search history.

(56) References Cited

U.S. PATENT DOCUMENTS

| | | | |
|---|---|---|---|
| 6,037,205 A | 3/2000 | Huh et al. | |
| 6,399,520 B1 * | 6/2002 | Kawakami et al. | 438/778 |
| 6,470,824 B2 | 10/2002 | Kawakami et al. | |
| 6,767,847 B1 * | 7/2004 | Hu et al. | 438/771 |
| 2003/0042557 A1 * | 3/2003 | Shimamoto et al. | 257/406 |
| 2005/0064667 A1 * | 3/2005 | Matsushita et al. | 438/287 |

FOREIGN PATENT DOCUMENTS

| | | |
|---|---|---|
| JP | 5 251439 | 9/1993 |
| JP | 7 221092 | 8/1995 |
| JP | 10 135207 | 5/1998 |
| JP | 2000 260707 | 9/2000 |
| JP | 2005 93865 | 4/2005 |

* cited by examiner

*Primary Examiner* — N Drew Richards
*Assistant Examiner* — Kyoung Lee
(74) *Attorney, Agent, or Firm* — Oblon, Spivak, McClelland, Maier & Neustadt, L.L.P.

(57) ABSTRACT

A method for forming an insulating film includes forming a silicon nitride film on a silicon surface by subjecting a target substrate wherein silicon is exposed in the surface to a treatment for nitriding the silicon, forming a silicon oxynitride film by heating the target substrate provided with the silicon nitride film in an $N_2O$ atmosphere, and nitriding the silicon oxynitride film.

20 Claims, 16 Drawing Sheets

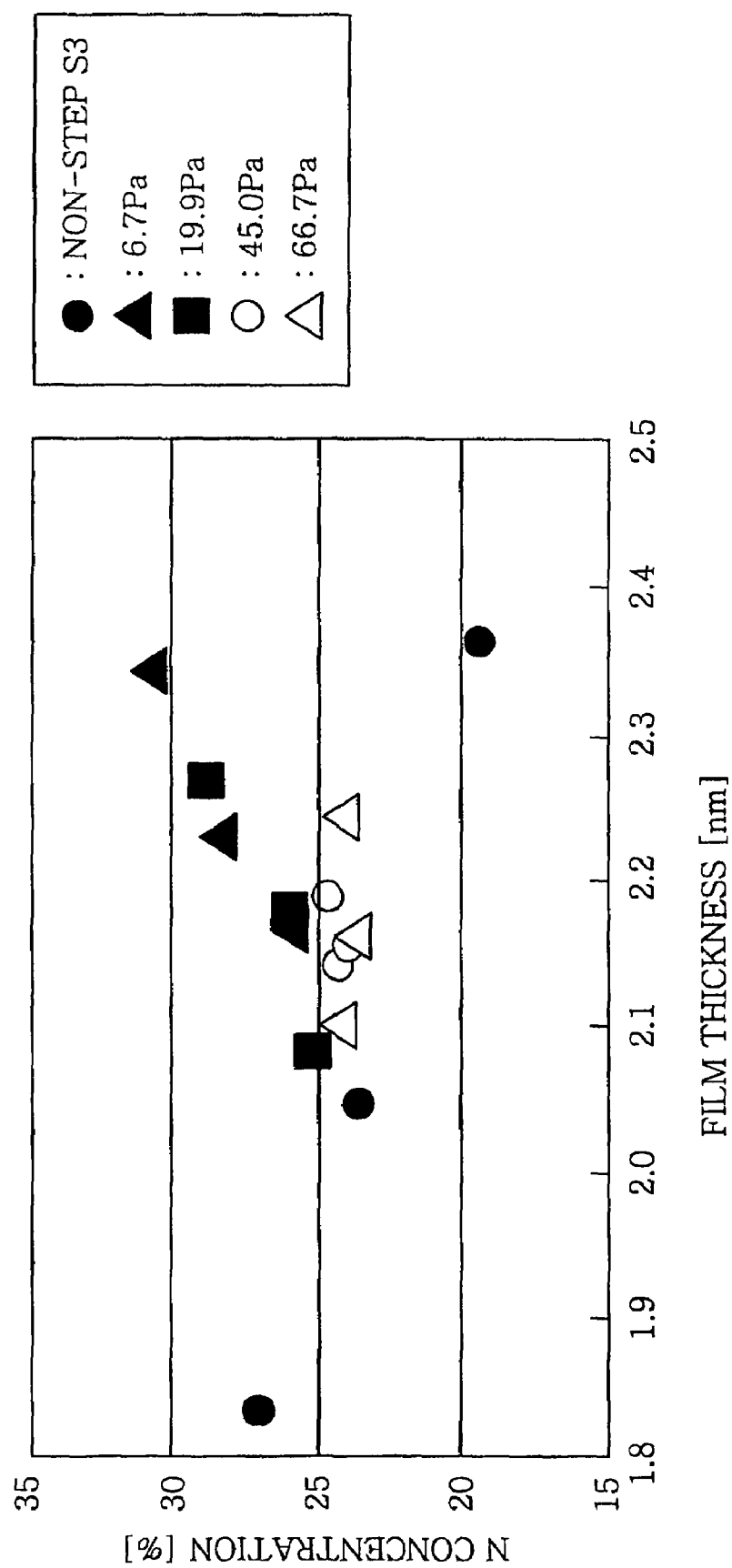

METHOD FOR FORMING INSULATING FILM AND METHOD FOR MANUFACTURING SEMICONDUCTOR DEVICE

FIELD OF THE INVENTION

The present invention relates to a method for forming an insulating film by performing nitriding and oxidation on a target substrate to be processed such as a semiconductor substrate or the like and a method for manufacturing a semiconductor device.

BACKGROUND OF THE INVENTION

In a manufacturing process of various semiconductor devices, a silicon nitride film is formed, as a gate insulating film of a transistor, on a semiconductor substrate. As for a method for forming a silicon nitride film, in addition to a method for depositing a silicon oxide film by CVD (Chemical Vapor Deposition), there is suggested a method for forming a silicon oxynitride film by introducing nitrogen into a silicon oxide film by plasma processing (e.g., Japanese Patent Laid-open Publication No. 2001-274148).

Further, as semiconductor devices are miniaturized, a gate insulating film becomes thinner, and it is required to form a gate insulating film having a film thickness of a few nm. Therefore, there is examined a possibility to form a silicon nitride film by nitriding silicon directly.

As for a method for forming a gate insulating film by introducing nitrogen into a silicon substrate directly, there is suggested a method for forming an insulating film including: a nitride film forming step of forming a first nitride film on a semiconductor substrate; an oxide layer forming step of forming a first oxide layer between the semiconductor substrate and the nitride film and also forming a second oxide layer on the nitride film; and an oxide layer nitriding step of forming a second nitride film or an oxynitride film on the first nitride film by nitriding the second oxide film (e.g., Japanese Patent Laid-open Publication No. 2005-93865 (JP2005-93865A)). This method has a purpose of obtaining a uniform film thickness of the formed gate insulating film and reducing an equivalent oxide thickness (EOT).

In the method disclosed in JP2005-93865A, the silicon nitride film is formed by nitriding the silicon substrate directly. Then, the silicon oxide film, the first silicon nitride film and the second silicon nitride film (or silicon oxynitride film) are formed on the interface of the silicon substrate by performing oxidation and nitriding. However, the gate insulating film formed by this method is disadvantageous in that interface states and fixed charges thereof change a threshold voltage and increase a flat band voltage (Vfb), thereby adversely affecting the mobility of electrons and holes in a transistor. That is, in the technique disclosed in JP2005-93865A, it is difficult to form a high-quality gate insulating film which ensures good electrical characteristics of a transistor.

SUMMARY OF THE INVENTION

In view of the above, the present invention provides an insulating film forming method capable of forming a high-quality thin insulating film by nitriding silicon directly and ensuring good electrical characteristics.

Further, the present invention provides a method for manufacturing a semiconductor device including the above-described insulating film as a gate insulating film.

In accordance with a first aspect of the present invention, there is provided a method for forming an insulating film including: forming a silicon nitride film on a silicon surface by performing a silicon nitriding on a target substrate wherein silicon is exposed in the surface; and forming a silicon oxynitride film by performing a heat treatment on the target substrate provided with the silicon nitride film in an $N_2O$ atmosphere.

In accordance with a second aspect of the present invention, there is provided a method for forming an insulating film including: forming a silicon nitride film on a silicon surface by performing a silicon nitriding on a target substrate wherein silicon is exposed in the surface; forming a silicon oxynitride film by performing a heat treatment on the target substrate provided with the silicon nitride film in an $N_2O$ atmosphere; and performing a nitriding of the silicon oxynitride film.

In accordance with a third aspect of the present invention, there is provided a method for forming an insulating film including: forming a silicon nitride film on a silicon surface by performing a silicon nitriding on a target substrate wherein silicon is exposed in the surface; forming a silicon oxynitride film by performing a heat treatment on the target substrate provided with the silicon nitride film in an $N_2O$ atmosphere; performing a nitriding of the silicon oxynitride film; and performing a heat treatment on the target substrate after performing the nitriding of the silicon oxynitride film.

In accordance with the first to third aspects of the present invention, the silicon nitriding is preferably performed by using a plasma of a rare gas and a nitrogen containing gas. Further, preferably, the silicon nitriding is performed by using a nitrogen containing plasma formed by introducing microwaves into a processing chamber by a planar antenna having a plurality of slots. In this case, the silicon nitriding is preferably performed by installing a dielectric plate having a plurality of through holes between the target substrate provided in the processing chamber and a plasma generation region. Further, a film thickness of the silicon nitride film formed by the silicon nitriding preferably ranges from 0.5 to 2 nm.

Further, in accordance with the first to third aspects of the present invention, the heat treatment in an $N_2O$ atmosphere is preferably performed in a mixed atmosphere of $N_2O$ and $N_2$, or in an $N_2O$ gas atmosphere. In this case, preferably a flow rate of $N_2O$ is in a range from 50 to 6000 mL/min (sccm), and a flow rate of $N_2$ is in a range from 0 to 3000 mL/min (sccm). Further, a processing pressure is preferably in a range from 133.3 to 1333 Pa. Further, a processing temperature is preferably in a range from 900 to 1200° C. and, more preferably, in a range from 1000 to 1200° C.

In accordance with the third aspect of the present invention, the heat treatment after the nitriding of the silicon oxynitride film is preferably performed in an $N_2$ gas atmosphere, an $O_2$ gas atmosphere, or in a mixed atmosphere of $N_2$ and $O_2$. In this case, a flow rate ratio of $O_2/N_2$ is preferably in a range from 0 to 0.01. Further, a processing pressure is preferably in a range from 133.3 to 1333 Pa. Further, a processing temperature is preferably in a range from 800 to 1200° C.

In accordance with a fourth aspect of the present invention, there is provided a method for manufacturing a semiconductor device including: forming a gate insulating film on a silicon substrate; and forming a gate electrode on the gate insulating film.

The gate insulating film is formed by a method includes: forming a silicon nitride film on a silicon surface by performing a silicon nitriding on a target substrate wherein silicon is exposed in the surface; and forming a silicon oxynitride film by performing a heat treatment on the target substrate provided with the silicon nitride film in an $N_2O$ atmosphere.

In accordance with a fifth aspect of the present invention, there is provided a method for manufacturing a semiconductor device including: forming a gate insulating film on a silicon substrate; and forming a gate electrode on the gate insulating film, The gate insulating film is formed by a method includes: forming a silicon nitride film on a silicon surface by performing a silicon nitriding on a target substrate wherein silicon is exposed in the surface; forming a silicon oxynitride film by performing a heat treatment on the target substrate provided with the silicon nitride film in an $N_2O$ atmosphere; and performing a nitriding of the silicon oxynitride film.

In accordance with a sixth aspect of the present invention, there is provided a method for manufacturing a semiconductor device including: forming a gate insulating film on a silicon substrate; and forming a gate electrode on the gate insulating film.

The gate insulating film is formed by a method includes: forming a silicon nitride film on a silicon surface by performing a silicon nitriding on a target substrate wherein silicon is exposed in the surface; forming a silicon oxynitride film by performing a heat treatment on the target substrate provided with the silicon nitride film in an $N_2O$ atmosphere; performing a nitriding of the silicon oxynitride film; and performing a heat treatment on the target substrate after performing the nitriding of the silicon oxynitride film.

In accordance with a seventh aspect of the present invention, there is provided a computer-readable storage medium storing a program for controlling a substrate processing system including a nitriding processing apparatus and a heat treatment apparatus. The program, when executed, controls the substrate processing system in a computer to execute an insulating film forming method including: forming a silicon nitride film on a silicon surface by performing a silicon nitriding on a target substrate wherein silicon is exposed in the surface; and forming a silicon oxynitride film by performing a heat treatment on the target substrate provided with the silicon nitride film in an $N_2O$ atmosphere.

In accordance with a eighth aspect of the present invention, there is provided a computer-readable storage medium storing a program for controlling a substrate processing system including a nitriding processing apparatus and a heat treatment apparatus. The program, when executed, controls the substrate processing system in a computer to execute an insulating film forming method includes: forming a silicon nitride film on a silicon surface by performing a silicon nitriding on a target substrate wherein silicon is exposed in the surface; forming a silicon oxynitride film by performing a heat treatment on the target substrate provided with the silicon nitride film in an $N_2O$ atmosphere; and performing a nitriding of the silicon oxynitride film.

In accordance with a nine aspect of the present invention, there is provided a computer-readable storage medium storing a program for controlling a substrate processing system including a nitriding processing apparatus and a heat treatment apparatus. The program, when executed, controls the substrate processing system in a computer to execute an insulating film forming method includes: forming a silicon nitride film on a silicon surface by performing a silicon nitriding on a target substrate wherein silicon is exposed in the surface; forming a silicon oxynitride film by performing a heat treatment on the target substrate provided with the silicon nitride film in an $N_2O$ atmosphere; performing a nitriding of the silicon oxynitride film; and performing a heat treatment on the target substrate after performing the nitriding of the silicon oxynitride film.

In accordance with the present invention, a silicon oxynitride film is formed by performing thermal oxidation on a silicon nitride film obtained by nitriding a silicon substrate directly, resulting in an insulating film having a nitrogen and oxygen concentration gradient in a film depth direction. This insulating film has small amount of fixed charges in the film and can suppress the flat band voltage Vfb. Therefore, when this insulating film is used as, e.g., a gate insulating film of a transistor, good electrical characteristics are ensured. The method of the present invention which can form a gate insulating film is suitable for forming a thin gate insulating film of less than about 2 nm (preferably, from about 0.5 to 1 nm) or the like in manufacturing semiconductor device such as a transistor or the like which is required to be miniaturized.

BRIEF DESCRIPTION OF THE DRAWINGS

FIG. 15 represents a graph illustrating a relationship among a processing pressure, a film thickness of a silicon oxynitride film, and nitrogen concentration in the film.

DETAILED DESCRIPTION OF THE EMBODIMENTS

The embodiments of the present invention will be described with reference to the accompanying drawings.

Figure 1:
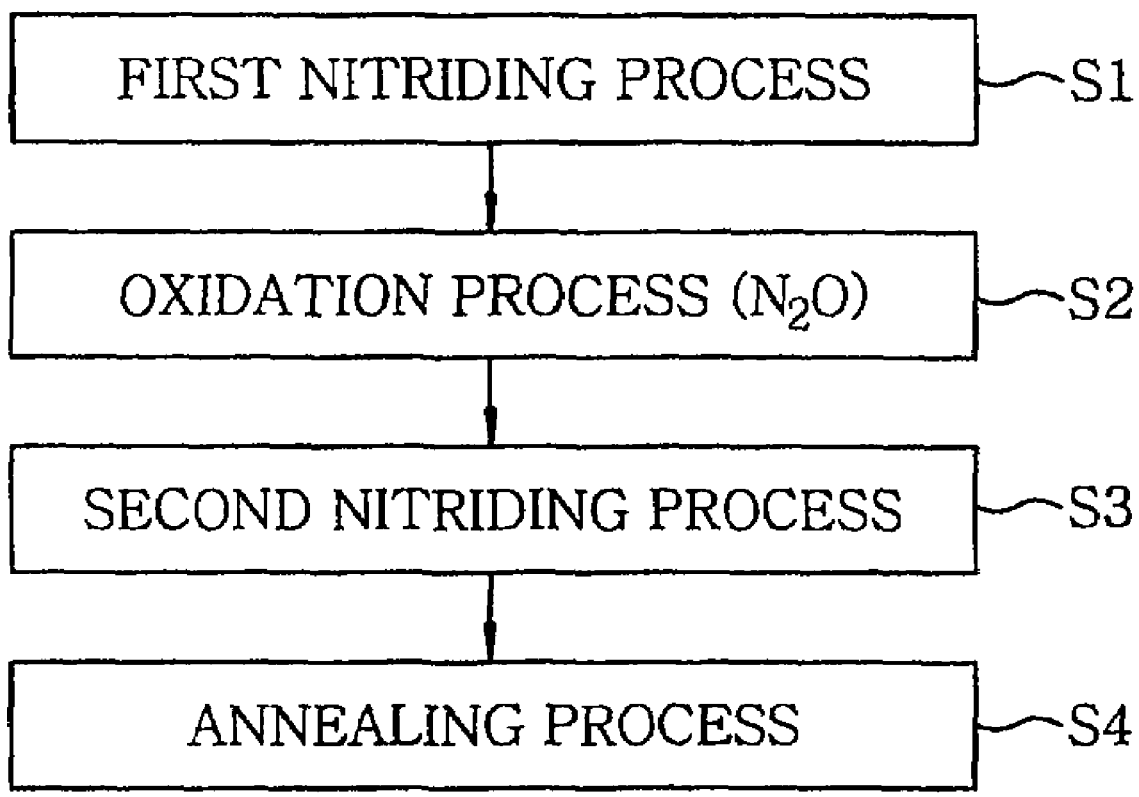
FIG. 1 is a flow chart showing an example of a manufacturing process of an insulating film of the present invention.
Figure 2:
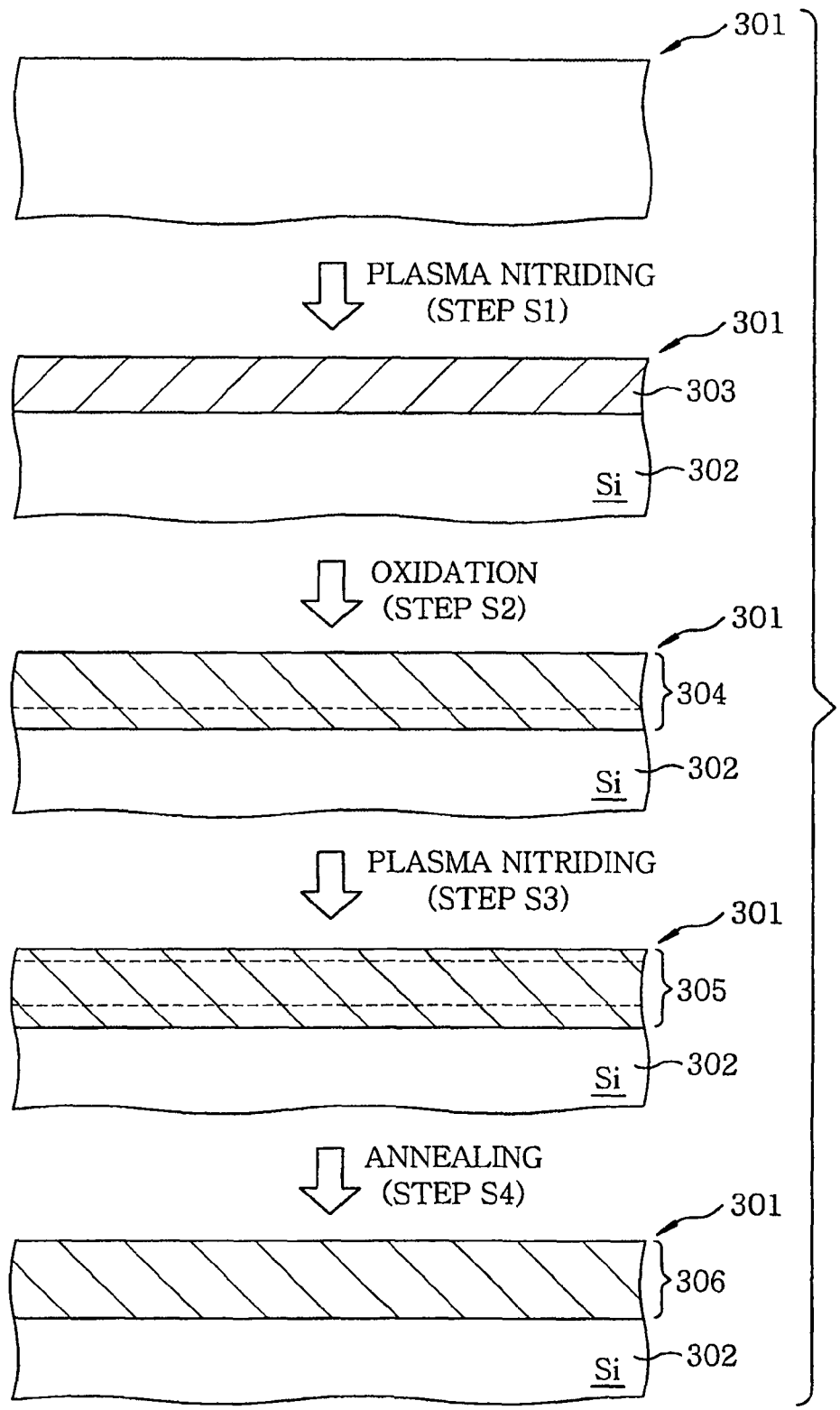
FIG. 2 provides process cross sectional views illustrating states in a vicinity of a substrate surface which correspond to respective steps shown in FIG. 1.

FIG. 1 is a flow chart showing exemplary steps of an insulating film forming method of the present invention. Here, there will be described, as an example, formation of an insulating film that can be used as a gate insulating film of a transistor. Further, FIG. 2 schematically illustrates states of a semiconductor wafer surface which correspond to respective steps S1 to S4 shown in FIG. 1. FIGS. 3A to 3D depict nitrogen and oxygen profiles in a depth direction of an insulating film which are measured after the completion of the above steps.

First of all, in a step S1, a nitriding process is performed on a silicon substrate 301 such as a semiconductor wafer W (hereinafter, referred to as a "wafer") or the like (first nitriding process). By performing the first nitriding process, a silicon nitride film (SiN film) 303 is formed on a silicon layer 302 of the silicon substrate 301. The nitriding process in the step S1 can be performed by various methods, e.g., heating, plasma processing and the like, without being limited to a specific method. However, in order to form a thin silicon nitride film of a thickness less than about 1 nm, it is preferable to perform a plasma nitriding process by using, e.g., a plasma processing apparatus 100 (to be described later) shown in FIG. 5 capable of performing a low-temperature processing at a low electron temperature of about 0.5 to 1 eV with a high-density plasma.

When the plasma nitriding process is performed by using the plasma processing apparatus, a flow rate of a rare gas, e.g., Ar or the like, is set to be in a range from about 100 to 6000 mL/min (sccm), and a flow rate of $N_2$ gas is set to be in a range from about 10 to 2000 mL/min (sccm). In this case, a flow rate ratio of Ar and $N_2$, i.e., $Ar/N_2$, is set to be in a range from about 0.5 to 600, and preferably in a range from about 2 to 200. Further, a processing pressure level in a chamber is controlled to be in a range from about 66.7 to 1333 Pa (in a range from about 0.05 to 10 Torr), preferably in a range from about 200 to 667 Pa (in a range from about 1.5 to 5 Torr), and more preferably about 200 to 266.6 Pa (in the range from about 1.5 to 2 Torr). The wafer W is heated to a temperature in a range from about 300 to 800° C., preferably in a range from about 400 to 800° C., and more preferably in a range from about 600 to 800° C. Moreover, a microwave power is preferably set to be in a range from about 500 to 2000 W. When a plate 60 (to be described later) is not provided, the processing pressure level is preferably controlled to be in a range from about 133.3 to 1333 Pa (in a range about 1 to 10 Torr). That is, in the first nitriding process of the step S1, it is preferable to perform the nitriding process under the conditions in which a plasma mainly including radicals is generated.

The silicon nitride film 303 obtained after the completion of the step S1 is a high-quality insulating film having a small gate leakage current Jg despite that a physical film thickness thereof is about 1 nm. In that state, however, fixed charges are generated at the interface between the silicon nitride film 303 and the silicon layer 302, as can be seen from FIG. 3A. Accordingly, the mobility of a carrier deteriorates, and a threshold voltage Vth of a transistor is shifted, which makes it difficult to obtain a high Gm (trans-conductance) or high on current (Ion) characteristics. The Gm and the ion characteristics greatly affect reliability of a device as a gate insulating film.

Next, in a step S2, the silicon substrate 301 on which the silicon nitride film 303 is formed is oxidized by using, e.g., a heat treatment apparatus 101 (to be described later) shown in FIG. 9 (thermal oxidation; first annealing). As a consequence, oxygen is introduced into the silicon nitride film 303, forming a silicon oxynitride film (SiON film) 304 having an oxygen concentration gradient decreasing from the surface side toward the interface with the silicon layer 302. In this oxidation process, an $N_2O$ gas or a gaseous mixture of $N_2O$ gas and $N_2$ gas is used. Preferably, a flow rate of $N_2O$ gas is in a range from about 50 to 6000 mL/min (sccm), and a flow rate of $N_2$ is in a range from about 0 to 6000 mL/min (sccm). At this time, an $N_2O$ partial pressure is preferably higher than or equal to about 3.3 Pa and lower than or equal to about 133.3 Pa. Further, the heat treatment is preferably performed for about 0.1 to 2 minutes at a processing pressure controlled to be in a range from about 133.3 to 1333 Pa and a processing temperature ranging from about 900 to 1200° C. It is preferable that the processing pressure is higher. Preferably, it is higher than or equal to about 1000° C. and, more preferably, it is in a range from about 1000 to 1200° C.

Figure 3:
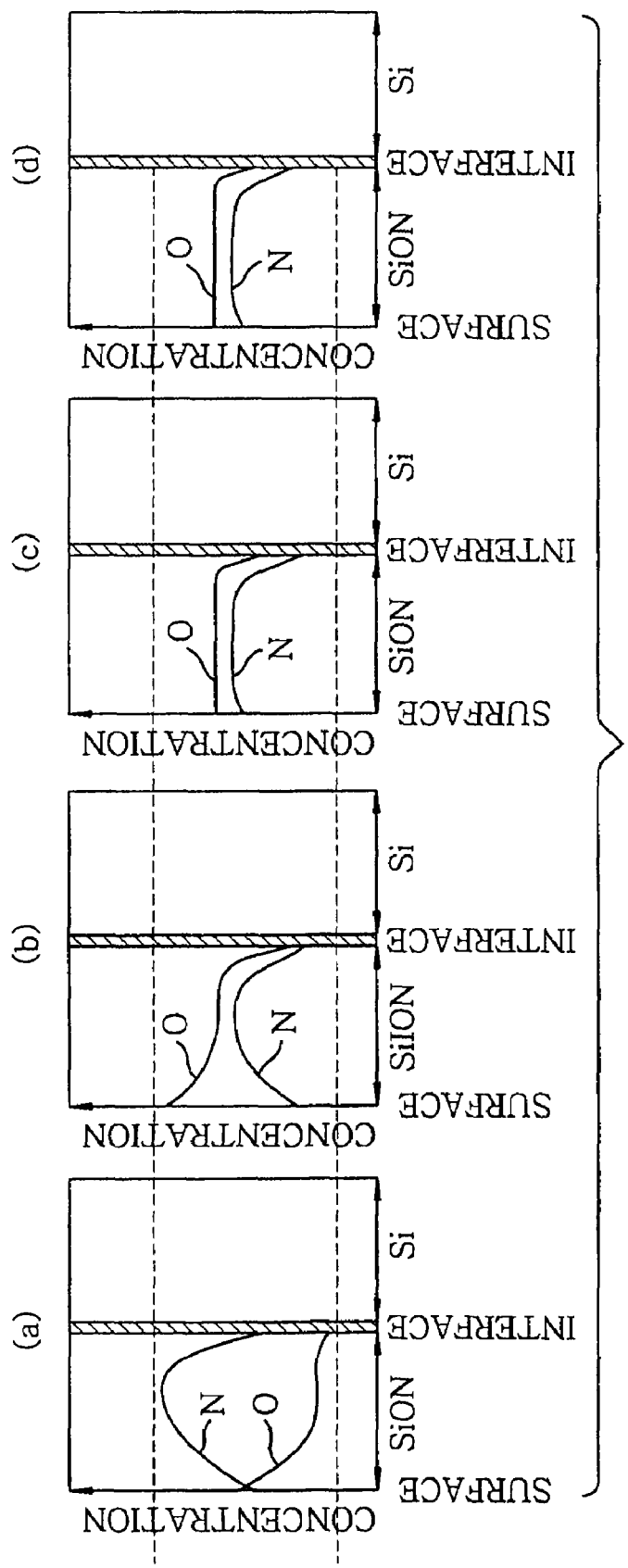
FIGS. 3A to 3D depict nitrogen and oxygen profiles in an insulating film which correspond to the respective steps shown in FIG. 1.

As illustrated in FIG. 3B, the silicon oxynitride film 304 formed by performing thermal oxidation at a high temperature ranging from about 1000 to 1200° C. in an $N_2O$ gas atmosphere has a nitrogen concentration profile which is low at the surface side and increases toward the interface with the silicon layer 302 in a depth direction but decreases at the interface. Meanwhile, the oxygen concentration has an overall tendency to decrease from the surface side of the silicon oxynitride film 304 toward the interface of the silicon layer 302, but shows a profile in which oxygen is introduced into the interface at a specific level of concentration. Since Si—O is formed at the interface between the silicon layer 302 and the silicon oxynitride film 304 having such nitrogen/oxygen concentration profile, the fixed charges in the insulating film can be reduced.

That is, by converting Si—SiN bonds into Si—SiO bonds, it is possible to reduce the interface states and the flat band voltage Vfb. In addition, the shift of the threshold voltage Vth of the transistor is improved, and high Gm or ion characteristics are obtained. Accordingly, the device characteristics are improved.

By performing the first nitriding process of the step S1 and the oxidation process of the step S2, it is possible to form an insulating film of a high Gm, reduced leakage current and Vfb, thereby obtaining good electrical characteristics. In addition to the processes of the steps S1 and S2, a second nitriding process of a step S3 may be performed, which makes it possible to further reduce the leakage current and Vfb. Further, in addition to the processes of the steps S1 to S3, an annealing process of a step S4 may be carried out. By performing the processes of the steps S1 to S3 or the processes of the steps S1 to S4, it is possible to form an insulating film having better electrical characteristics and obtain good device characteristics.

In the step S3, only a surface side of the silicon oxynitride film (SiON film) 304 is subjected to a plasma nitriding process by using, as a plasma processing apparatus, e.g., the plasma processing apparatus 100 (to be described later) shown in FIG. 5 (second nitriding process). By performing the nitriding process of the step S3, nitrogen is newly introduced into the surface side of the silicon oxynitride film 304 (e.g., up to about 0.5 nm in a depth direction) and, thus, the silicon oxynitride film 305 having an increased nitrogen concentration at a surface layer compared to that measured after the completion of the step S2 (see FIG. 3B) is formed, as shown in FIG. 3C. By increasing the nitrogen concentration at the surface side, it is possible to prevent a leakage current and penetration of boron while maintaining an effect of suppressing a shift of a threshold voltage Vth of a transistor and a high Gm and high ion characteristics. As a consequence, the reliability of the semiconductor devices can be improved.

When the substrate surface is nitrided by the plasma processing apparatus, a flow rate of rare gas, e.g., Ar or the like, is set to be in the range from about 100 to 6000 mL/min (sccm), and a flow rate of $N_2$ gas is set to be in the range from about 5 to 2000 mL/min (sccm). In this case, a flow rate ratio of Ar and $N_2$, i.e., $Ar/N_2$, ranges from about 0.5 to 600, and preferably from about 2 to 200. Further, a processing pressure level in a chamber is controlled to be in the range from about 0.66 to 1333 Pa (5 mTorr to 10 Torr), preferably in the range from about 1.33 to 26.6 Pa (5 mTorr to 0.2 Torr), and more preferably in the range from about 1.33 to 12 Pa (5 to 90 mTorr). A temperature of the wafer W is heated to be in the range from about 200 to 600° C., preferably in the range from about 200 to 400° C., and more preferably in the range from about 300 to 400° C. Besides, a microwave power is preferably in the range from about 500 to 2000 W.

When the plate 60 is not provided, it is preferable that the processing pressure level is controlled to be in the range from about 6.6 to 26.6 Pa (in the range from about 0.05 to 0.2 Torr).

As described above, in the second nitriding process of the step S3, the nitriding process is preferably performed by generating a plasma mainly including ions. This plasma preferably has an electron temperature in a range from about 0.5 to 2 eV and a high density ranging from about $1 \times 10^{10}$ to $5 \times 10^{12}/cm^3$.

By performing the processes of the steps S1 to S3, on the silicon layer 302 of the silicon substrate 301, nitrogen of a certain level is introduced near the surface toward the interface with the silicon layer 302, thus forming the silicon oxynitride film 305 having a profile of nitrogen concentration decreasing in a depth direction at the interface.

Thereafter, in the step S4, annealing is performed to improve insulation characteristics by densifying the silicon oxynitride film 305. The annealing can be carried out by using, e.g., the heat treatment apparatus 101 shown in FIG. 9. At this time, the annealing can be performed in an $N_2$ gas atmosphere, an $N_2O$ gas atmosphere, an $O_2$ gas atmosphere or a mixed atmosphere of these gases, and preferably in an $N_2$ gas atmosphere, an $O_2$ gas atmosphere or a mixed atmosphere of $N_2$ and $O_2$. Here, a flow rate of $N_2$, $N_2O$ or $O_2$ is preferably in the range from about 100 to 6000 mL/min (sccm). Further, a flow rate ratio of $N_2$ and $O_2$, i.e., $O_2/N_2$, is preferably about 0 to 0.01. A processing pressure is preferably higher than or equal to about 66.7 Pa, and more preferably in the range from about 133.3 to 1333 Pa. A processing temperature is preferably in the range from about 800 to 1200° C., and more preferably in the range from about 800 to 1000° C. Processing time is preferably in the range from about 0.5 to 2 minutes. After the completion of the annealing of the step S4, the nitrogen and oxygen profiles in the insulating film 306 are hardly changed, as illustrated in FIG. 3D, compared to those measured after the completion of the step S3 (see FIG. 3C). However, since in Si—N bonds in the insulating film 306 can be cured by annealing, N losses which occur as time elapses are reduced and a dense silicon oxynitride film of good quality can be formed.

By performing the processes of the steps S1 to S4, it is possible to form the insulating film 306 with a total film thickness smaller than or equal to about 1 nm, and preferably about 0.5 to 1 nm. In this insulating film 306, the fixed charges in the film and the interface states are reduced and, also, the flat band potential Vfb is low. Therefore, when it is used as a gate insulating film of a transistor, good ion characteristics and a high Gm are obtained, and a Vth shift hardly occurs, thereby achieving good electrical characteristics. By employing the insulating film thus produced, a highly reliable device can be fabricated.

Figure 4:
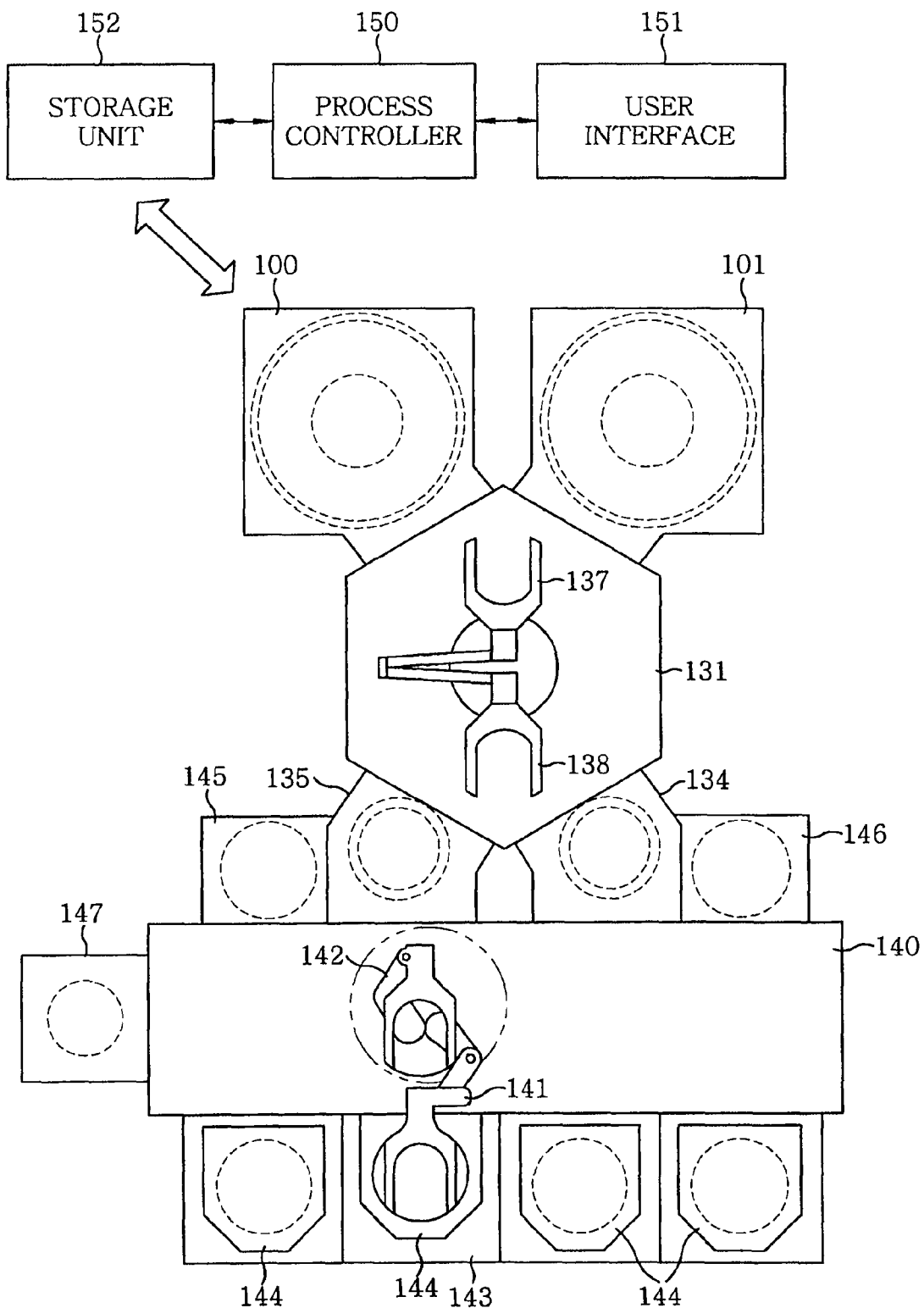
FIG. 4 is a schematic view describing a substrate processing system that can be used to form an insulating film of the present invention.

Next, FIG. 4 shows a schematic configuration of a substrate processing system 200 that can be preferably used to implement the gate insulating manufacturing method of the present invention. A transfer chamber 131 for transferring the wafer W is installed substantially at the center of the substrate processing system 200. Disposed around the transfer chamber 131 are the plasma processing apparatus 100 for performing a plasma nitriding process on the wafer W, the heat treatment apparatus 101 for performing on the wafer W a heat treatment including thermal oxidation, a gate valve (not shown) for communication or block between the processing chambers, and two load lock units 134 and 135 for transferring the wafer W between the transfer chamber 131 and an atmospheric transfer chamber 140.

Provided near the load lock units 134 and 135 are a preliminary cooler unit 145 for performing a preliminary cooling operation and a cooler unit 146 for performing a cooling operation. Further, when the load lock units 134 and 135 are used as cooler units, it is not required to install the preliminary cooler unit 145 and the cooler unit 146.

Transfer arms 137 and 138 are provided in the transfer chamber 131, and transfer the wafer W with respect to each of the units.

Disposed in the atmospheric transfer chamber 140 connected to the load lock units 134 and 135 are transfer units 141 and 142. The atmospheric transfer chamber 140 is maintained in a clean environment by a down-flowing clean air. The atmospheric transfer chamber 140 is connected to a cassette unit 143, and the wafer W can be loaded and unloaded with respect to four cassettes 144 set on the cassette unit 143 by the transfer units 141 and 142. Moreover, an alignment bar 147 is provided adjacent to the atmospheric transfer chamber 140, and an alignment of the wafer W is performed therein.

Each component of the substrate processing system 200 is controlled by a process controller 150 having a CPU. The process controller 150 is connected to a user interface 151 which includes a keyboard for a process manager to input a command to operate the substrate processing system 200, a display for showing an operational status of the substrate processing system 200, and the like.

Further, the process controller 150 is connected with a storage unit 152 for storing therein control programs (software) for implementing various processes in the substrate processing system 200 under the control of the process controller 150, and recipes including processing condition data and the like.

If necessary, the process controller 150 executes a recipe read from the storage unit 152 in response to instructions from the user interface 151, thereby implementing a required process in the substrate processing system 200 under the control of the process controller 150. Moreover, the control programs or the recipes such as the processing condition data and the like can be stored in a computer-readable storage medium, e.g., a CD-ROM, a hard disk, a flexible disk, a flash memory or the like, or transmitted on-line from another device via, e.g., a dedicated line when necessary.

Figure 5:
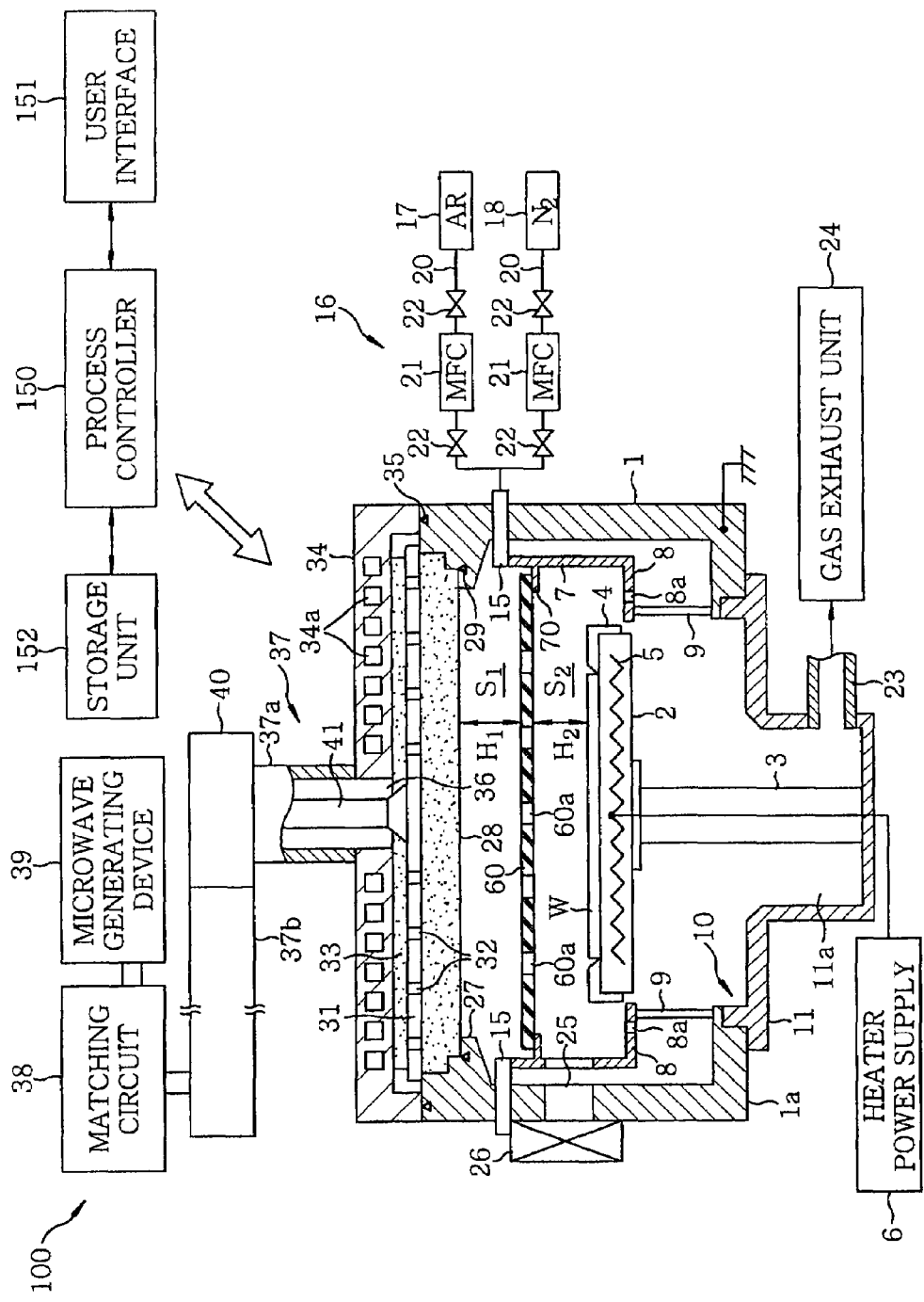
FIG. 5 presents a schematic cross sectional view of a plasma processing apparatus in the substrate processing system shown in FIG. 4.

FIG. 5 is a schematic cross sectional view showing an example of a plasma processing apparatus 100 as a plasma nitriding unit in the substrate processing system 200. This plasma processing apparatus 100 is configured as an RLSA (radial line slot antenna) microwave plasma processing apparatus capable of generating a microwave plasma of a high density and a low electron temperature by introducing microwaves into a processing chamber by using a planar antenna having a plurality of slots, particularly an RLSA. Therefore, this plasma processing apparatus 100 can perform a process using a plasma having a density ranging from about $1 \times 10^{10}$ to $5 \times 10^{12}/cm^3$ and a low electron temperature ranging from about 0.5 to 2 eV, and thus can be preferably used to form a gate insulating film or the like in a manufacturing process of various semiconductor devices such as a MOS (Metal-Oxide-Silicon) transistor and the like.

When the plate 60 (to be described later) is employed, a low-damage process can be performed by using a plasma having radical components of a low electron temperature ranging from about 1 to 2 eV in a first plasma region $S_1$ and from about 0.5 to 1 eV in a second plasma region $S_2$.

The plasma processing apparatus 100 includes a substantially cylindrical airtight chamber 1 that is grounded. A circular opening 10 is formed at a substantially central portion of a bottom surface 1a of the chamber 1, and an exhaust chamber 11 projecting downward is provided on the bottom surface 1a while communicating with the opening 10.

A mounting table 2 made of ceramic, e.g., AlN or the like, is provided in the chamber 1 to horizontally support a wafer W as a substrate to be processed. Further, the mounting table 2 is supported by a cylindrical supporting member 3 extending upward from a central bottom portion of the exhaust chamber 11, the supporting member 3 being made of ceramic, e.g., AlN or the like. A guide ring 4 for guiding the wafer W is provided on an outer periphery portion of the mounting table 2. Furthermore, a resistance heater 5 is buried in the mounting table 2 to heat the mounting table 2 by a power supplied from a heater power supply 6. The wafer W as a substrate to be processed is heated by heat thus generated. At this time, a heating temperature of the wafer W can be controlled to be set between a room temperature and about 800° C. In addition, a cylindrical liner 7 made of quartz is provided on an inner periphery of the chamber 1. Besides, an annular baffle plate 8 having a plurality of gas exhaust holes 8a is provided at a periphery of the mounting table 2 to thereby uniformly exhaust the inside of the chamber 1. The baffle plate 8 is supported by a plurality of support columns 9.

The mounting table 2 is provided with wafer supporting pins (not shown) for supporting and vertically moving the wafer W. The wafer supporting pins can be protruded from or retracted into the top surface of the mounting table 2.

Provided above the mounting table 2 is the plate 60 for reducing ion energy in the plasma. By using this plate 60, when a silicon nitride film having a thin film thickness smaller than or equal to, e.g., about 1 nm, is formed, the controllability of a film thickness becomes good. This plate 60 is made of a dielectric material such as ceramic, e.g., quartz, sapphire, SiN, SiC, $Al_2O_3$, AlN or the like, or polysilicon, single crystalline silicon, amorphous silicon or the like. In order to prevent metal contamination, it is preferable to use a high purity silicon-based material such as quartz, SiN, polysilicon, single crystalline silicon, amorphous silicon or the like. Moreover, the plate 60 is supported by engaging an outer peripheral portion thereof with support portions 70 projecting inward from the liner 7 in the chamber 1 along the entire circumference. Besides, the plate 60 may be supported in a different manner.

Preferably, the plate 60 is attached near the wafer W. The distance between the plate 60 and the wafer W (height $H_2$) is preferably ranging from, e.g., about 3 to 50 mm, and more preferably ranging from about 25 to 35 mm. In this case, the distance between the top surface of the plate 60 and the bottom surface of a is preferably ranging from, e.g., about 30 to 150 mm, and more preferably ranging from about 50 to 100 mm. By installing the plate 60 at that location, silicon can be nitrided uniformly while reducing plasma damage.

The space above the plate 60 serves as the first plasma region $S_1$, and the space below the plate 60 serves as the second plasma region $S_2$. It is preferable that the volume of the second plasma region $S_2$ is set to be the same as or smaller than the first plasma region $S_1$. The ratio between the height of the first plasma region $S_1$ and the height of the second plasma region $S_2$, i.e., $H_1/H_2$, is preferably ranging from, e.g., about 0.6 to 50, and more preferably ranging from about 1.4 to 4.

Figure 6:
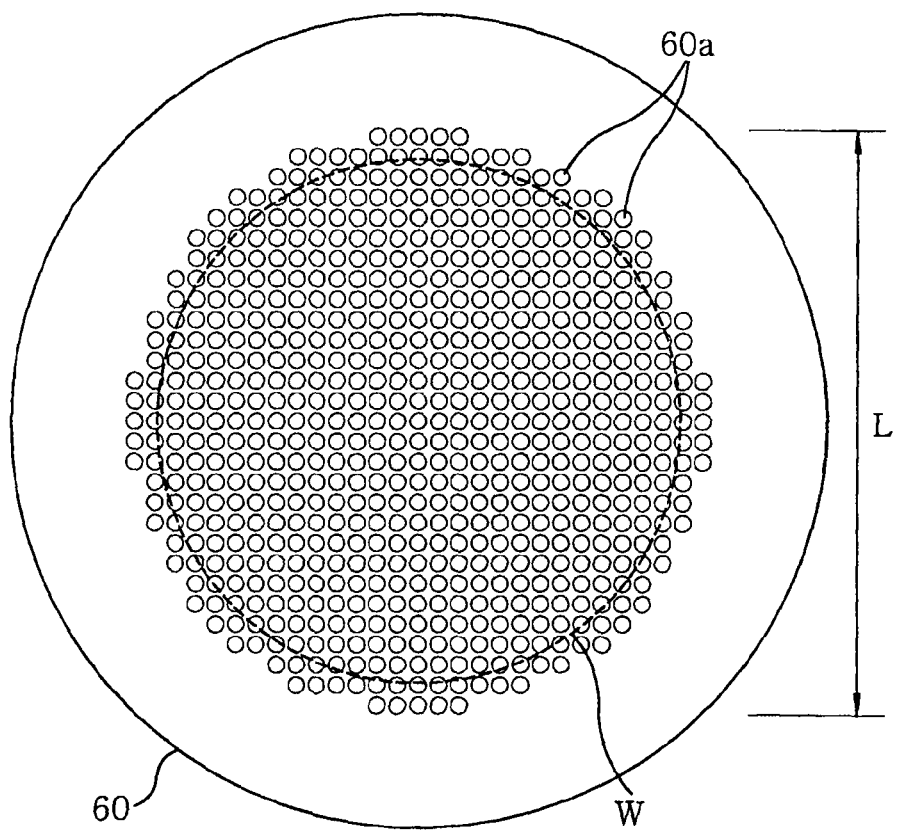
FIG. 6 represents a top view of a plate of the plasma processing apparatus shown in FIG. 5.
Figure 7:
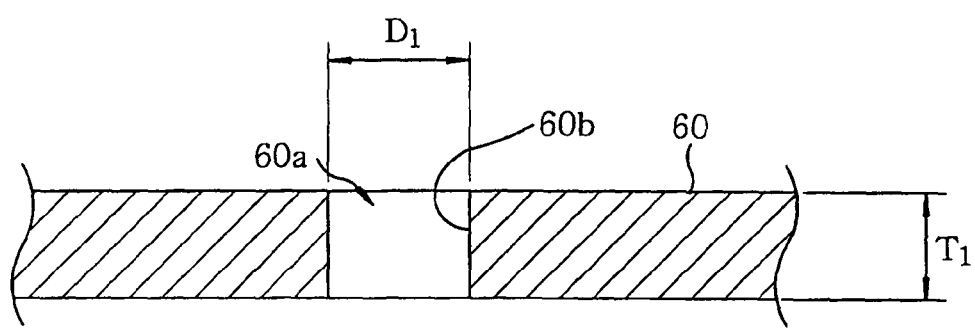
FIG. 7 describes a cross sectional view of principal parts of the plate of the plasma processing apparatus shown in FIG. 5.

The plate 60 has a plurality of through holes 60a. FIGS. 6 and 7 illustrate the plate 60 in detail. FIG. 6 shows a top view of the plate 60, and FIG. 7 is a cross sectional view of a principal part of the plate 60.

The through holes 60a of the plate 60 are substantially uniformly arranged so that the installation area of the through holes 60a is slightly larger than the mounting area of the wafer W which is indicated by a dashed line in FIG. 6. To be specific, in FIG. 6, the through holes 60a are arranged in an area enlarged outwardly from the outer periphery of the wafer W so that a length L corresponding to a diameter of a circle connecting the outer periphery of the arrangement area of the through holes 60a with respect to the wafer W having a diameter of about 300 mm is larger than a pitch of the through holes 60a by, e.g., a value ranging from about 5 to 30 mm. Further, the through holes 60a can be arranged in the entire surface of the plate 60. By arranging the through holes 60a in a region wider than the wafer diameter, the nitriding process can be uniformly performed.

A diameter $D_1$ of the through holes 60a can be randomly varied. For example, it is preferably ranging from about 2 to 15 mm, and more preferably ranging from about 2.5 to 10 mm. Further, for example, a diameter of each of the through holes 60a is about 10 mm in FIG. 6. The diameters of the holes may be varied in accordance with the locations of the through holes 60a in the plate 60. Moreover, the through holes 60a may be arranged in a random pattern, e.g., a concentric circular pattern, a radial pattern, a spiral pattern or the like. In addition, a thickness $T_1$ of the plate 60 is preferably, e.g., in the range from about 2 to 20 mm, and more preferably in the range from about 2 to 5 mm. By specifying the diameter of the through holes 60a, it is possible to reduce $V_{dc}$ $(=V_f-V_p)$, i.e., potential difference between floating potential $(V_f)$ and plasma potential $(V_p)$) and ion damage to the wafer W. As a consequence, the uniform nitriding process can be realized.

This plate 60 serves as an ion energy reducing device for reducing the total amount of ion energy in the plasma.

That is, the plate 60 made of a dielectric material allows radicals in the plasma to pass therethrough and blocks most of ions. To do so, it is preferable to collectively consider an opening area of the through holes 60*a* of the plate 60, the diameter $D_1$ of the through holes 60*a*, the shapes or the arrangement pattern of the through holes 60*a*, the thickness $T_1$ of the plate 60 (i.e., a height of a wall 60*b*), the installation location of the plate 60 (a distance from the wafer W), as will be described later. For example, when the opening diameter of the through holes 60*a* is set to be in the range from about 2.5 to 10 mm, the ratio of the opening area of the through holes 60*a* to the area of the wafer W in the region of the plate 60 which corresponds to the wafer W (i.e., region overlapped with the wafer W) is preferably ranging from about 10 to 50%. By controlling the opening area ratio, the nitriding process can be performed at a low $V_{dc}$ while suppressing the ion energy.

Although the single plate 60 is provided in the plasma processing apparatus 100 shown in FIG. 5, two or more plates can be superposedly provided if necessary. The opening area of the through holes 60*a* or the ratio thereof can be properly adjusted depending on the processing conditions, the object of the plasma nitriding process and the like.

An annular gas introducing member 15 is provided on a sidewall of the chamber 1, and a gas supply system 16 is connected to the gas introducing member 15. Further, the gas introducing member 15 may be disposed in a form of a shower shape. The gas supply system 16 includes, e.g., an Ar gas supply source 17, and an $N_2$ gas supply source 18, and these gases are supplied to the gas introducing member 15 through respective gas lines 20, and then are introduced through the gas introducing member 15 into the chamber 1. Each of the gas lines 20 is provided with a mass flow controller 21 and opening/closing valves 22 disposed at an upstream and a downstream of the mass flow controller 21. Instead of the $N_2$ gas, as for a nitrogen containing gas, it is possible to use, e.g., $NH_3$ gas, gaseous mixture of $N_2$ and $H_2$, hydrazine or the like. However, dangling bond defects are easily caused by H, so that it is preferable to use a nitrogen containing gas which does not contain hydrogen, such as $N_2$ or the like. Further, instead of the Ar gas, a rare gas such as Kr, Xe, He or the like can be used.

A gas exhaust line 23 is connected on a side surface of the exhaust chamber 11, and a gas exhaust unit 24 including a high speed vacuum pump is connected with the gas exhaust line 23. By operating the gas exhaust unit 24, a gas in the chamber 1 is uniformly discharged into a space 11*a* of the exhaust chamber 11 and then is exhausted through the gas exhaust line 23. Accordingly, the inside of the chamber 1 can be depressurized to a predetermined vacuum level, e.g., 0.133 Pa, at a high speed.

Provided on the sidewall of the chamber 1 is a loading/unloading port 25 for transferring the wafer W between the chamber 1 and a transfer chamber (not shown) adjacent to the plasma processing apparatus 100 and a gate valve 26 for opening and closing the loading/unloading port 25.

An upper portion of the chamber 1 has an opening, and a ring-shaped support portion 27 is projected along a peripheral portion of the opening. A microwave transmitting plate 28 made of a dielectric material, e.g., quartz or ceramic such as $Al_2O_3$, AlN, or the like, is airtightly disposed on the support portion 27 via a sealing member 29. Therefore, the inside of the chamber 1 is airtightly maintained.

Figure 8:
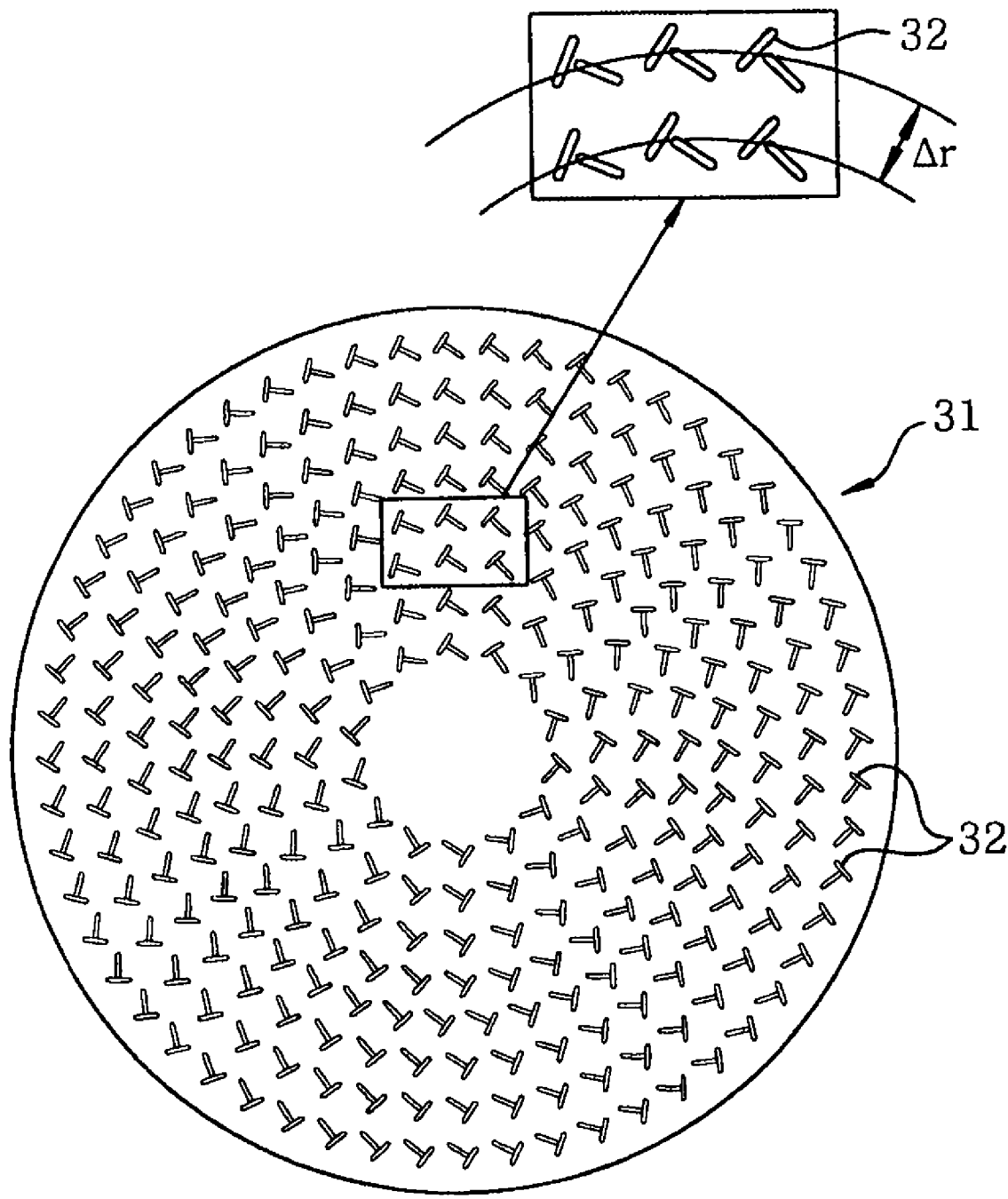
FIG. 8 is a top view of a planar antenna member of the plasma processing apparatus shown in FIG. 5.

A circular plate-shaped planar antenna member 31 is provided on the microwave transmitting plate 28 while facing the mounting table 2. The planar antenna member 31 is fixed to a top portion of the sidewall of the chamber 1. The planar antenna member 31 is made of, e.g., an aluminum plate or a copper plate coated with gold or silver, and has a plurality of slot-shaped microwave radiation holes 32 formed therethrough in a predetermined pattern. For example, as shown in FIG. 8, the microwave radiation holes 32 having pairs of holes of an elongated shape, and typically, the microwave radiation holes 32 forming each of pairs are disposed in a T shape. These pairs of microwave radiation holes 32 are concentrically arranged.

A length of the microwave radiation hole 32 or an arrangement interval therebetween is determined depending on a wavelength λg of the microwave. For example, the microwave radiation holes 32 are spaced apart from each other at the interval of λg/4, λg/2 or λg. Further, in FIG. 8, the interval between the adjacent microwave radiation holes 32 that are concentrically disposed is indicated as Δr. Further, the microwave radiation holes 32 may have another shape, e.g., a circular shape, an arc shape or the like. Further, the microwave radiation holes 32 can be arranged in another pattern, e.g., a spiral pattern, a radial pattern or the like, without being limited to the concentric circular pattern.

Provided on the top surface of the antenna member 31 is a retardation member 33 having a dielectric constant greater than that of a vacuum. Since the wavelength of the microwave becomes longer in the vacuum, the retardation member 33 has a function of controlling a plasma by shortening the wavelength of the microwave. The planar antenna member 31 may be in contact with or separated from the microwave transmitting plate 28 and the retardation member 33.

A shield lid 34 made of a metal material, e.g., aluminum, stainless steel or the like, is provided on a top surface of the chamber 1 to cover the planar antenna member 31 and the retardation member 33. The top surface of the chamber 1 and the shield lid 34 are sealed by sealing members 35. Cooling water paths 34*a* are formed in the shield lid 34. By circulating cooling water therethrough, it is possible to cool the shield lid 34, the retardation member 33, the planar antenna member 31 and the microwave transmitting plate 28. Further, the shield lid 34 is grounded.

The shield lid 34 has an opening 36 at a center of a top wall thereof, and a waveguide 37 is connected with the opening. A microwave generating device 39 for generating microwaves is connected with an end portion of the waveguide 37 via a matching circuit 38. Accordingly, a microwave having a frequency of, e.g., 2.45 GHz, which is generated from the microwave generating device 39, is propagated to the antenna member 31 via the waveguide 37. The microwave may have a frequency of 8.35 GHz, 1.98 GHz or the like.

The waveguide 37 includes a coaxial waveguide 37*a* having a circular cross section and extending upward from the opening 36 of the shield lid 34, and a rectangular waveguide 37*b* extending in a horizontal direction and connected with an upper portion of the coaxial waveguide 37*a* via a mode transducer 40. The mode transducer 40 between the rectangular waveguide 37*b* and the coaxial waveguide 37*a* has a function of converting a TE mode of the microwave propagating in the rectangular waveguide 37*b* into a TEM mode. An internal conductor 41 is extended in the coaxial waveguide 37*a*, and a lower portion of the internal conductor 41 is fixedly connected to a center of the antenna member 31. As a consequence, the microwave is efficiently and uniformly propagated to the antenna member 31 via the internal conductor 41 of the coaxial waveguide 37*a* radially.

In the RLSA plasma processing apparatus 100 configured as described above, the process for forming a silicon nitride film by directly nitriding the silicon layer of the wafer W and the like can be performed in following sequences.

First of all, the wafer W on which a silicon layer is formed is loaded through the loading/unloading port 25 into the chamber 1 by opening the gate valve 26 and then mounted on the mounting table 2. Next, Ar gas and $N_2$ gas are respectively introduced at predetermined respective flow rates from the Ar gas supply source 17 and $N_2$ gas supply source 18 into the chamber 1 through the gas introducing member 15. Further, a pressure in the chamber 1 is adjusted to a predetermined level, and a temperature of the wafer W is heated to a predetermined level.

Next, the microwave from the microwave generating device 39 is transmitted to the waveguide 37 via the matching unit 38. The microwave is supplied to the planar antenna member 31 via the rectangular waveguide 37b, the mode transducer 40, the coaxial waveguide 37a and the internal conductor 41 in that order, and then is emitted from the holes 32 (slots) of the planar antenna member 31 toward a space above the wafer W in the chamber 1 through the microwave transmitting plate 28. The microwave propagates in the rectangular waveguide 37b in the TE mode. The TE mode of the microwave is converted into the TEM mode in the mode transducer 40, and the microwave propagates in the TEM mode through the coaxial waveguide 37a toward the antenna member 31. At this time, it is preferable that the power of the microwave generating device 39 is, e.g., in a range from about 0.5 to 5 kW.

An electromagnetic field is formed in the chamber 1 by the microwaves emitted from the planar antenna member 31 into the chamber 1 via the microwave transmitting plate 28, thereby converting Ar gas and $N_2$ gas into a plasma. By emitting the microwaves through the plurality of holes 32 of the planar antenna member 31, the microwave plasma has a high density ranging from about $1 \times 10^{10}/cm^3$ to $5 \times 10^{12}/cm^3$ and an electron temperature lower than or equal to about 1.5 eV near the wafer W.

The microwave plasma thus generated causes less plasma damage due to ions and the like to the base film. Further, by providing the dielectric plate 60 having through holes 60a in the chamber 1, the first plasma region S1 for generating a plasma and the second plasma region S2 for processing the wafer W by the plasma that has passed through the plate 60 are separately provided. Accordingly, the ion energy in the second plasma region S2 is greatly reduced, and the sheath voltage Vdc near the substrate can be decreased. In addition, the electron temperature of the plasma can be reduced to be about 1 eV or less and more preferably to be about 0.7 eV or less. As a result, the plasma damage can be further reduced.

Further, N can be directly introduced into the silicon by an action of active species, mainly nitrogen radicals N* and the like, in the plasma, so that a uniform SiN film can be formed.

Figure 9:
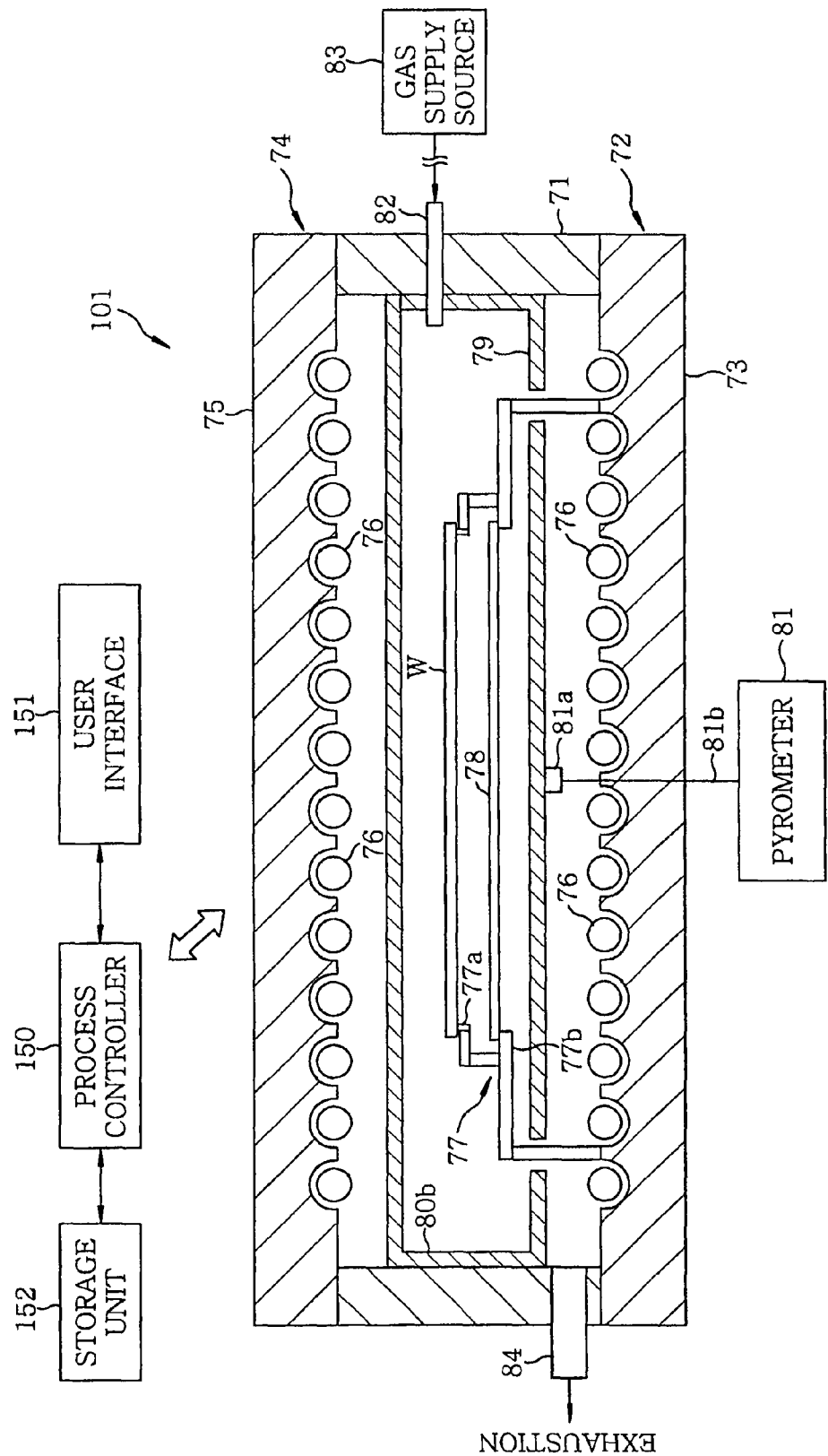
FIG. 9 illustrates a schematic cross sectional view of a heat treatment apparatus in the processing system shown in FIG. 4.

Next, FIG. 9 is a schematic diagram of the heat treatment apparatus 101 as a heat treatment unit in the substrate processing system 200. The heat treatment apparatus 101 is configured as a single wafer RTP (Rapid Thermal Processing) apparatus for performing an RTA (Rapid Thermal Annealing) with high controllability, and can be used to perform, e.g., annealing or thermal oxidation, on a thin film formed on the wafer W at a high temperature in the range from about 800 to 1200° C.

Besides, the heat treatment apparatus is not limited to a single substrate heat treatment apparatus, and may be a batch-type heat treatment apparatus capable of processing a plurality of substrates simultaneously.

In FIG. 9, a reference number 71 indicates a cylindrical processing chamber, and a lower heating unit 72 is detachably provided on the bottom of the processing chamber 71. Further, an upper heating unit 74 is detachably provided on the top of the processing chamber 71 to face the lower heating unit 72. The lower heating unit 72 includes a plurality of tungsten lamps 76 as heating units disposed on a top surface of a cooling jacket 73 where a cooling water path (not shown) is formed. In the same manner, the upper heating unit 74 has a water cooling jacket 75 where a cooling water path (not shown) is formed and a plurality of tungsten lamps 76 disposed on a bottom surface thereof. In addition, as for the lamp, it is possible to use, e.g., a halogen lamp, a Xe lamp, a mercury lamp, a flash lamp or the like, other than the tungsten lamp 76. The tungsten lamps 76 arranged to face each other in the processing chamber 1 are connected to a power supply (not shown) and a control unit (process controller 150) for controlling power supplied therefrom, so that the heat discharge rate can be controlled.

A supporting portion 77 for supporting the wafer W is provided between the lower heating unit 72 and the upper heating unit 74. The supporting portion 77 includes a wafer supporting pin 77a for supporting the wafer W maintained in a processing space of the processing chamber 71 and a liner mounting portion 77b for supporting a hot liner 78 for measuring a temperature of the wafer W during the processing. Further, the supporting portion 77 is connected to a rotation mechanism (not shown) which rotates the entire supporting portion 77 about a vertical axis. Accordingly, the wafer W rotates at a predetermined speed during the processing, and the uniformity of the heat treatment is realized.

A pyrometer 81 is disposed below the chamber 71. By measuring heat rays from the hot liner 78 via a port 81a and an optical fiber 81b with the use of the pyrometer 81 during the heat treatment, the temperature of the wafer W can be measured indirectly. Further, the temperature of the wafer W can be measured directly.

In addition, a quartz member 79 is arranged between the bottom of the hot liner 78 and the tungsten lamps 76 of the lower heating unit 72, and is provided with the port 81a, as illustrated. Further, a plurality of ports 81a may be provided.

Further, a quartz member 80a is arranged between the wafer W and the tungsten lamps 76 of the upper heating unit 74. Also, a quartz member 80b is disposed on an inner peripheral surface of the chamber 71 to surround the wafer W.

Moreover, a lifter pin (not shown) for supporting and vertically moving the wafer W is provided to penetrate the hot liner 78, and is used to load and unload the wafer W.

Sealing members (not shown) are provided between the lower heating unit 72 and the processing chamber 71 and between the upper heating unit 74 and the processing chamber 71, and the inside of the processing chamber 71 is maintained at an airtight state.

Further, a gas supply source 83 connected to a gas inlet line 82 is disposed at a side portion of the processing chamber 71, so that gases such as $N_2O$ gas, $O_2$ gas, Ar gas and the like can be introduced into the processing space of the processing chamber 71. Furthermore, a gas exhaust line 84 is provided at a lower portion of the processing chamber 71, so that the inside of the processing chamber 71 can be depressurized by a gas exhaust unit (not shown).

In the heat treatment apparatus 101 configured as described above, after the wafer W is set on the wafer supporting portion 77 in the processing chamber 71, an airtight space is formed. Next, the tungsten lamps 76 of the lower heating unit 72 and the upper heating unit 74 are turned ON by supplying a predetermined power (not shown) from the power supply (not shown) thereto under the control of the process controller 150, so that heat is generated from each of the tungsten lamps 76. The heat rays thus generated are irradiated to the wafer W via the quartz members 79 and 80a. The wafer W is rapidly heated from the above and below thereof based on the recipe (heating rate, heating temperature and the like) while being rotated. While the wafer W is heated, the gas exhaust unit (not shown) is driven to discharge gases through the gas exhaust line 84, thereby depressurizing the inside of the chamber 71.

The wafer W is rotated by rotating the entire supporting portion 77 about a vertical axis at a predetermined rotation speed by a rotation mechanism (not shown) during the heat treatment. As a result, the uniformity of the heat supplied to the wafer W is ensured.

Further, during the heat treatment, the temperature of the hot liner 78 can be measured by the pyrometer 81, and the temperature of the wafer W can be measured indirectly. The temperature data measured by the pyrometer 81 is feedback to the process controller 150. When the measured temperature is different from the set temperature in the recipe, the power supplied to the tungsten lamps 76 is adjusted through the control of the process controller 150.

After the heat treatment is completed, the lower heating unit 72, the upper heating unit 74 and the tungsten lamps 76 are turned OFF. Further, a purge gas such as an inert gas, e.g., nitrogen or the like, is introduced through a purge port (not shown) into the processing chamber 71, while discharging gases through the gas exhaust line 84, thereby the wafer W is cooled. Thereafter, the cooled wafer W is unloaded from the processing chamber 71.

In the substrate processing system 200 configured as described above, a series of processes of the steps S1 and S2, preferably steps S1 to S3, and more preferably steps S1 to S4 shown in FIG. 1 are executed, thereby forming the high-quality insulating film 306 on a surface of silicon such as single crystalline silicon or polycrystalline silicon.

That is, first of all, the wafer W is received from any one of the cassettes 144 on the cassette unit 143 by the transfer unit 141 or 142 of the atmospheric transfer chamber 140, and then is loaded into any one of the load lock units 134 and 135. After the inside of the load lock unit 134 or 135 is depressurized, the wafer W is unloaded from the load lock unit 134 or 135 by using the transfer arm 137 or 138 into the transfer chamber 131, and then is loaded into the plasma processing apparatus 100. Next, the first nitriding process of the step S1 is performed under the processing conditions described above. After the first nitriding process is completed, the wafer W is unloaded from the plasma processing apparatus 100 by the transfer arm 137 or 138, and then is loaded into the heat treatment apparatus 101. Then, the oxidation process of the step S2 is performed by the heat treatment apparatus 101 under the above-described processing conditions.

Upon completion of the oxidation process, the processes of the steps S3 and S4 may be executed consecutively. In this case, the wafer is unloaded from the heat treatment apparatus 101 by the transfer arm 137 or 138, and then is loaded into the plasma processing apparatus 100. Further, the second nitriding process of the step S3 is performed in the plasma processing apparatus 100 under the processing conditions described above. After the second nitriding process is completed, the wafer W is unloaded from the plasma processing apparatus 100 by the transfer arm 137 or 138, and then is loaded into the heat treatment apparatus 101. Then, the annealing of the step S4 is performed under the above-described processing conditions.

When all the processes are completed, the wafer W is unloaded from the heat treatment apparatus 101 by the transfer arm 137 or 138, and then is loaded into any one of the load lock units 134 and 135. Further, the inside of the load lock unit 134 or 135 is set to the atmospheric pressure. Next, the wafer W is unloaded from the load lock unit 134 or 135 by the transfer unit 141 or 142 of the atmospheric transfer chamber 140, and then is returned to any one of the cassettes 144 in the cassette unit 143. In this manner, a series of processes for a single wafer W are completed. This system enables the processing to be performed in a vacuum state without being exposed to the atmosphere. Accordingly, the insulating film can be formed without causing contamination from organic materials and the like.

Figure 10A:
FIG. 10A provides a process cross sectional view showing a manufacturing process of a transistor to which an insulating film forming method of the present invention is applied, and illustrates a state in which a device isolation layer is formed.
Figure 10B:
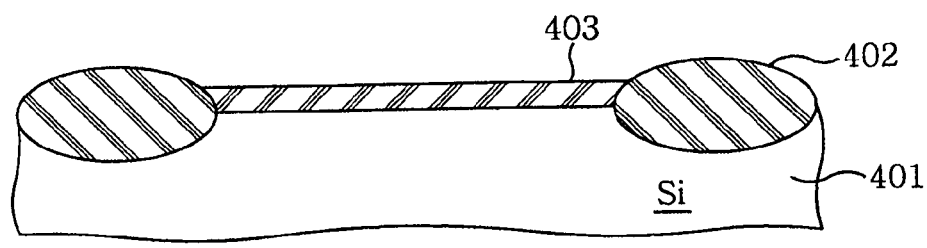
FIG. 10B presents a process cross sectional view showing a manufacturing process of a transistor to which an insulating film forming method of the present invention is applied, and depicts a state in which an insulating film is formed.
Figure 10C:
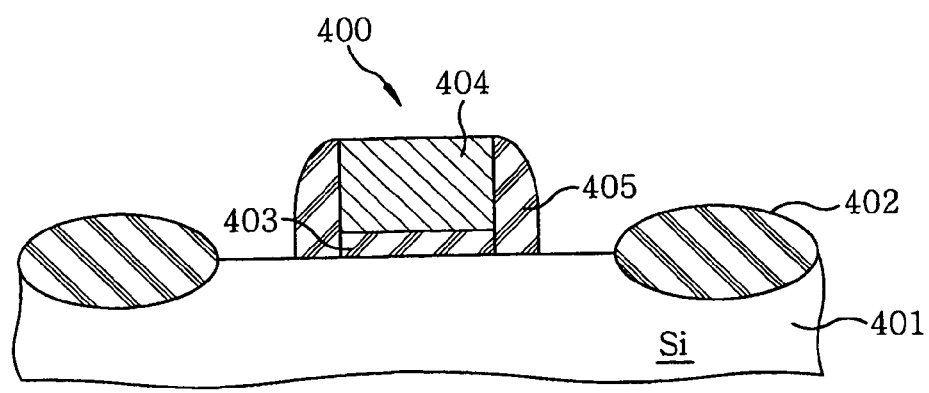
FIG. 10C represents a process cross sectional view showing a manufacturing process of a transistor to which an insulating film forming method of the present invention is applied, and describes a state in which a transistor is formed.

The insulating film 306 thus formed can be used as a gate insulating film formed of a silicon oxynitride film in manufacturing various semiconductor devices such as a transistor and the like. As a preferred prospect thereof, it is particularly useful to form a thin film in a next generation device, e.g., a gate insulating film having a film thickness of less than about 1 nm and preferably in a range from about 0.5 to 1 nm. FIGS. 10A to 10C provide process cross sectional views for explaining an example to which the plasma nitriding processing method of the present invention is applied.

As illustrated in FIG. 10A, a well (not shown) is formed on a P-type or an N-type silicon substrate 401, and a device isolation layer 402 is formed by, e.g., a LOCOS method. Further, the device isolation layer 402 may be formed by an STI (Shallow Trench Isolation) method.

Next, as shown in FIG. 10B, a gate insulating film 403 is formed on a surface of the silicon substrate 401 in accordance with the sequences of the steps S1 to S4 shown in FIG. 1. Although a film thickness of the gate insulating film 403 varies depending on target devices, it is preferably ranging from about 0.5 to 1 nm.

Further, a polysilicon layer 404 is formed on the gate insulating film 403 by a CVD at a temperature higher than, e.g., about 400° C. Next, etching is performed by using a mask having a pattern formed by a photolithography technique, to form a gate electrode. Further, a gate electrode structure is not limited to a single layer structure of the polysilicon layer 404, but may be a polycide structure including a silicide of, e.g., tungsten, molybdenum, tantalum, titanium, cobalt, nickel or the like, to reduce a specific resistance of the gate electrode and obtain high operation speed. After the gate electrode is formed, a source/drain (not shown) is formed by performing ion implantation and activation, and a sidewall 405 of an insulating film such as $SiO_2$, SiN or the like is formed, thereby fabricating a transistor 400 having a MOS structure shown in FIG. 10C.

Hereinafter, test results for confirming the effects of the present invention will be described.

A silicon nitride film (SiN film) was formed on a surface of single crystalline silicon of a wafer W by using the plasma processing apparatus 100 having a configuration shown in FIG. 5. The plasma nitriding process was performed under the following conditions: a processing gas of Ar gas and $N_2$ gas respectively having flow rates of $1000/200$ mL/min(sCm); a wafer temperature set at about 600° C.; a processing pressure of about 199.9 Pa (1500 mTorr); a microwave power of about 1.5 kW; and processing time of about 36 seconds. As for the plate 60 of the plasma processing apparatus 100, there was used one having through holes 60a having diameters of about 9.5 mm, 9.7 mm and 11 mm.

Next, the wafer W having the silicon nitride film (SiN film) was thermally treated (first annealing process) in an $N_2O$ atmosphere by using the heat treatment apparatus 101 having a configuration shown in FIG. 9. As a consequence, a silicon nitride film (SiON film) was formed. The following conditions were applied to the thermal oxidation process: a processing gas of an $N_2O$ gas having a flow rate of about 2 L/min(slm); a wafer temperature set at about 1100° C.; and a processing pressure of about 133.3 Pa (1 Torr). For comparison, a wafer W having a silicon nitride film (SiN film) was thermally treated in an $O_2$ atmosphere, instead of in an $N_2O$ atmosphere, to form a silicon nitride film (SiON film). At this time, the following conditions were applied: a processing gas of an $O_2$ gas having a flow rate of about 2 L/min(slm); a wafer temperature set at about 1100° C.; and a processing pressure of about 666.65 Pa (5 Torr).

Figure 11A:
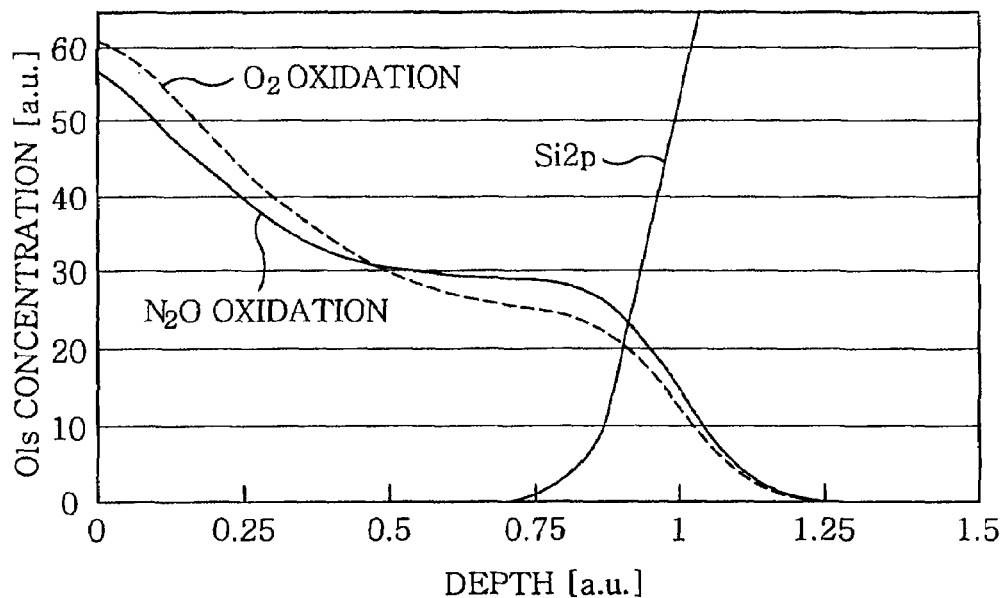
FIG. 11A is a graph showing an XPS analysis result of measuring in-film oxygen concentration in the case of forming a silicon oxynitride film by heating a wafer having a silicon nitride film in an $N_2O$ atmosphere.
Figure 11B:
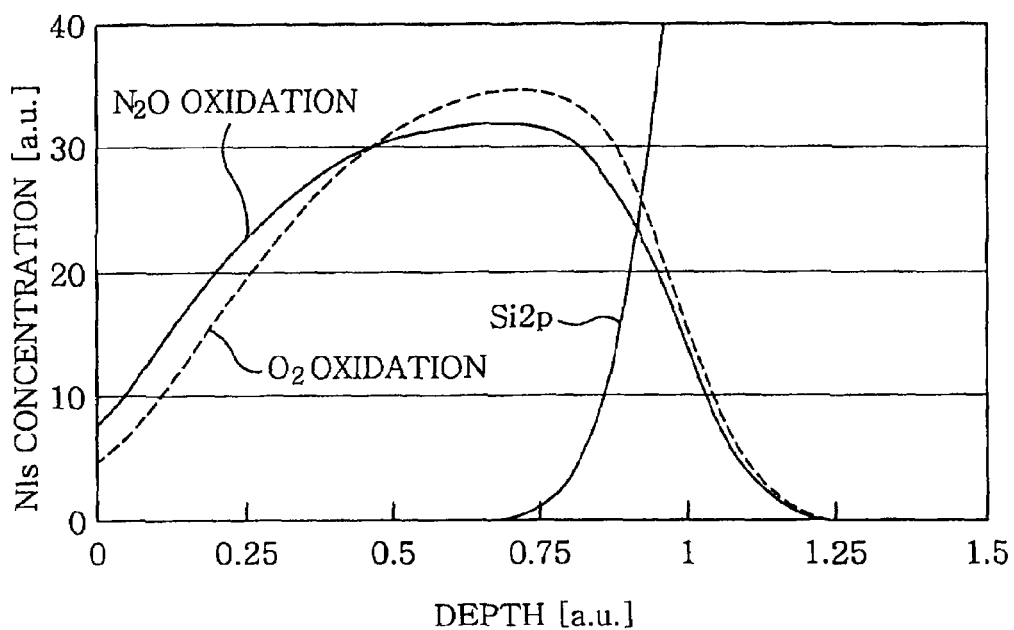
FIG. 11B is a graph showing an XPS analysis result of measuring in-film nitrogen concentration in the case of forming a silicon oxynitride film by heating a wafer having a silicon nitride film in an $N_2O$ atmosphere.

The distribution of oxygen atoms (O1s) and nitrogen atoms (N1s) in the silicon oxynitride film (SiON film) in a film thickness direction was measured by using an angle resolved X-ray photoelectron spectroscopy (AR-XPS). Results thereof are shown in FIGS. 11A and 11B. In FIG. 11A, the vertical axis indicates concentration of normalized oxygen atoms (O1s), and the horizontal axis indicates a normalized depth. A scale of 0 indicates a surface, and a scale of 1 indicates an SiON—Si interface in which Si concentration is 50%. Further, in FIG. 11B, the vertical axis represents concentration of normalized nitrogen atoms (N1s), and the horizontal axis represents a normalized depth. A scale of 0 indicates a surface, and a scale of 1 indicates an SiON—Si interface in which Si concentration is 50%. Also, FIGS. 11A and 11B indicate concentration of normalized silicon atoms (Si2p).

From the results shown in FIGS. 11A and 11B, it is found that, when the heat treatment was performed in the $N_2O$ atmosphere, compared to when it was performed in the $O_2$ gas atmosphere, a small amount of oxygen atoms (O1s) was distributed near the surface of the silicon oxynitride film (SiON film), and a large amount of oxygen atoms (O1s) was distributed near the interface with the silicon. The reason that the film quality varies depending on the processing gases is because the diffusion movement of oxygen atoms in the silicon nitride film (SiN film) is different between the oxidation process using an $N_2O$ gas and the oxidation process using an $O_2$ gas.

Further, as shown in FIG. 11A, the silicon oxynitride film thermally oxidized by using an $N_2O$ gas has an oxygen concentration gradient gradually decreasing from a surface side toward an SiON—Si interface in a film thickness direction, and shows a profile in which oxygen of certain amount exists at the SiON—Si interface. Furthermore, FIG. 11B shows a nitrogen concentration gradient in a film depth direction, and thus, FIGS. 11A and 11B present profiles in which oxygen and nitrogen (SiON) exist in the interface regions. Further, the silicon oxynitride film thermally oxidized by using an $N_2O$ gas shows a profile in which the large amount of oxygen atoms (O1s) are distributed in the SiON—Si interface, compared to the silicon oxynitride film thermally oxidized by using an $O_2$ gas. By introducing oxygen into the SiON—Si interface, fixed charges are reduced, and the interface state decreases. Accordingly, the mobility of carriers in the transistor having this silicon oxynitride film as a gate insulating film is improved. Further, Gm or ion characteristics are improved, and a Vth shift is suppressed. Besides, leakage current density Jg decreases, so that a leakage current can be suppressed.

Next, a MOS transistor was fabricated by using the silicon nitride film as a gate insulating film, and the electrical characteristics thereof were examined.

In this test, a silicon nitride film (SiN film) was formed on a surface of single crystalline silicon of a wafer W by using the plasma processing apparatus 100 having a configuration shown in FIG. 5. The following conditions were applied to the plasma processing: a processing gas of mixture of Ar and N2 respectively having flow rates of Ar/N2=1000/200 mL/min (sccm); a wafer temperature set at about 600° C.; a processing pressure of about 199.9 Pa (1500 mTorr); a microwave power of about 1.5 kW; and processing time of about 36 seconds.

Next, the wafer W having the silicon nitride film (SiN film) was thermally oxidized by using the heat treatment apparatus 101 having a configuration shown in FIG. 9, thereby forming a silicon oxynitride film (SiON film). The thermal oxidation was carried out under the following conditions to vary nitrogen concentration in the silicon oxynitride film (SiON film).

Figure 12:
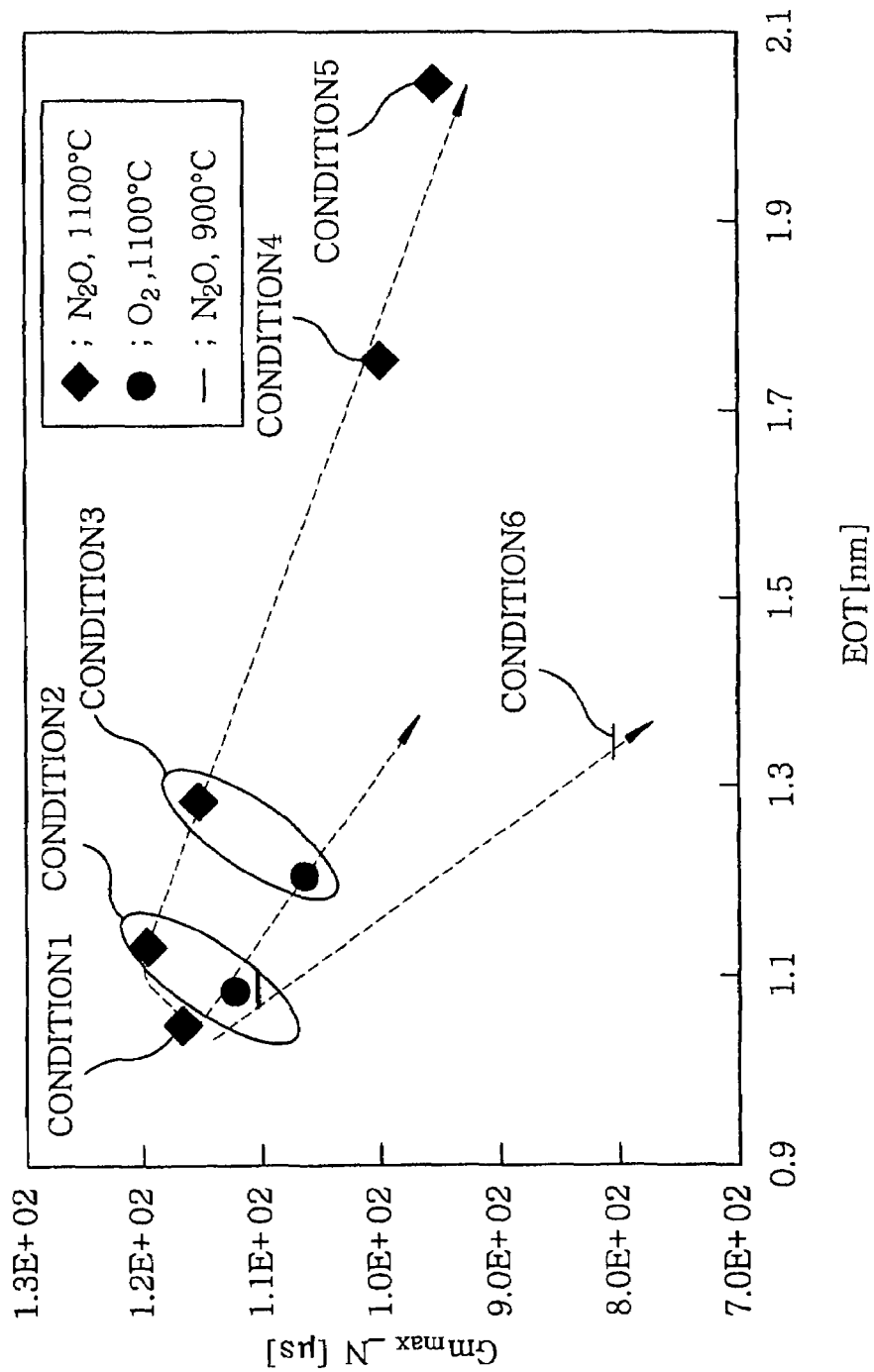
FIG. 12 illustrates a graph depicting a relationship between EOT and $Gm_{max}$ of a transistor.

<Condition 1: In-Film Nitrogen Concentration of 30%>
a processing pressure of about 266.6 Pa (2 Torr); a processing gas having a mixture of $N_2$ and $N_2O$ respectively having flow rates of about 1.7/0.3 L/min(slm); a processing temperature set at about 1100° C.; and processing time of about 10 seconds <Condition 2: In-Film Nitrogen Concentration of 23%>
(i) a processing pressure of about 266.6 Pa (2 Torr); a processing gas having a mixture of $N_2$ and $N_2O$ respectively having flow rates of about 1.7/0.3 L/min(slm); a processing temperature set at about 1100° C.; and processing time of about 23 seconds (ii) a processing pressure of about 666.5 Pa (5 Torr); a processing gas of $O_2$ having a flow rate of about 2 L/min(slm); a processing temperature set at about 1100° C.; and processing time of about 15 seconds (iii) a processing pressure of about 666.5 Pa (5 Torr); a processing gas having a mixture of $N_2$ and $N_2O$ respectively having flow rates of about 1.7/0.3 L/min(slm); a processing temperature set at about 900° C.; and processing time of about 25 seconds <Condition 3: In-Film Nitrogen Concentration of 20%>
(i) a processing pressure of about 133.3 Pa (1 Torr); a processing gas of $N_2O$ having a flow rate of about 2 L/min (slm); a processing temperature set at about 1100° C.; and processing time of about 23 seconds (ii) a processing pressure of about 9997.5 Pa (75 Torr); a processing gas of $O_2$ having a flow rate of about 2 L/min(slm); a processing temperature set at about 1100° C.; and processing time of about 9 seconds <Condition 4: In-Film Nitrogen Concentration of 15%>
a processing pressure of about 666.5 Pa (5 Torr); a processing gas of $N_2O$ having a flow rate of about 2 L/min(slm); a processing temperature set at about 1100° C.; and processing time of about 23 seconds <Condition 5: In-Film Nitrogen Concentration of 10%>
a processing pressure of about 9997.5 Pa (75 Torr); a processing gas of $N_2O$ having a flow rate of about 2 L/min(slm); a processing temperature set at about 1100° C.; and processing time of about 14 seconds <Condition 6: In-Film Nitrogen Concentration of 18%>
a processing pressure of about 9997.5 Pa (75 Torr); a processing gas of $N_2O$ having a flow rate of about 2 L/min(slm); a processing temperature controlled at about 900° C.; and processing time of about 19 seconds FIG. 12 shows a relationship between an $SiO_2$ equivalent thickness (EOT) of a gate insulating film and a maximum value of a transfer conductance ($Gm_{max}$). From FIG. 12, it can be found that $Gm_{max}$ greatly varied depending on oxidation conditions. When a silicon oxynitride film (SiON film) formed at a processing temperature of about 1100° C. by using an $N_2O$ gas as a processing gas for oxidation was used as a gate insulating film, compared to when a silicon oxynitride film formed by using an $O_2$ gas was used, a significantly high $Gm_{max}$ was obtained at the same EOT, which verified that good electrical characteristics were obtained. That is, by using an $N_2O$ gas, the $Gm_{max}$ can be increased without increasing an EOT and the ion characteristics can be improved.

When an $N_2O$ gas was used as a processing gas, a higher $Gm_{max}$ and better electrical characteristics were obtained in the case of using as a gate insulating film a silicon oxynitride film (SiON film) thermally oxidized at about 1100° C. than in the case of using as a gate insulating film a silicon oxynitride film thermally oxidized at about 900° C.

From the above results, it can be found that an $N_2O$ gas is preferably used for a thermal oxidation process for oxidizing a silicon nitride film, and the thermal oxidation process is preferably performed at a temperature higher than about 900° C., preferably in the range from about 1000 to 1200° C., for a short period of time in the range from about 5 to 60 seconds. Further, it can be found that the $N_2O$ partial pressure is preferably in the range from about 3.3 to 133.3 Pa.

Then, the effects of the processing temperature to the electrical characteristics of the transistor in the thermal oxidation process (step S2) using an $N_2O$ gas were examined by the following method.

First of all, a surface of single crystalline silicon of a wafer W was processed by a 1% dilute hydrofluoric acid (DHF) and, then, a plasma nitriding process was performed by using the plasma processing apparatus 100 having a configuration shown in FIG. 5. Accordingly, a silicon nitride film (SiN film) was formed on the silicon surface. The plasma nitriding process was performed under the following conditions: a processing gas having a mixture of Ar and $N_2$ respectively having flow rates of about $1000/200$ mL/min(sccm); a wafer temperature set at about 400° C.; a processing pressure in the range from about 6.7 to 199.9 Pa (in the range about 50 to 1500 mTorr); a microwave power of about 1.5 kW; and processing time of about 50 seconds.

Next, the wafer W having the silicon nitride film (SiN film) was thermally oxidized by using the heat treatment apparatus 101 having a configuration shown in FIG. 9, thereby forming a silicon oxynitride film (SiON film). The thermal oxidation was carried out under the following conditions: a processing pressure in the range from about 40 to 1333 Pa (in the range from about 300 mTorr to 10 Torr); a processing gas of $N_2O$ having a flow rate of 2 L/min(sccm); varied processing temperatures of about 1000° C., 1050° C. or 1100° C.; and processing time ranging from about 10 to 70 seconds. Then, an NMOS transistor having as a gate insulating film the silicon nitride film (SiON film) thus formed was fabricated, and $Gm_{max}$ and Jg at a gate voltage of +1.1 V were measured.

Figure 13:
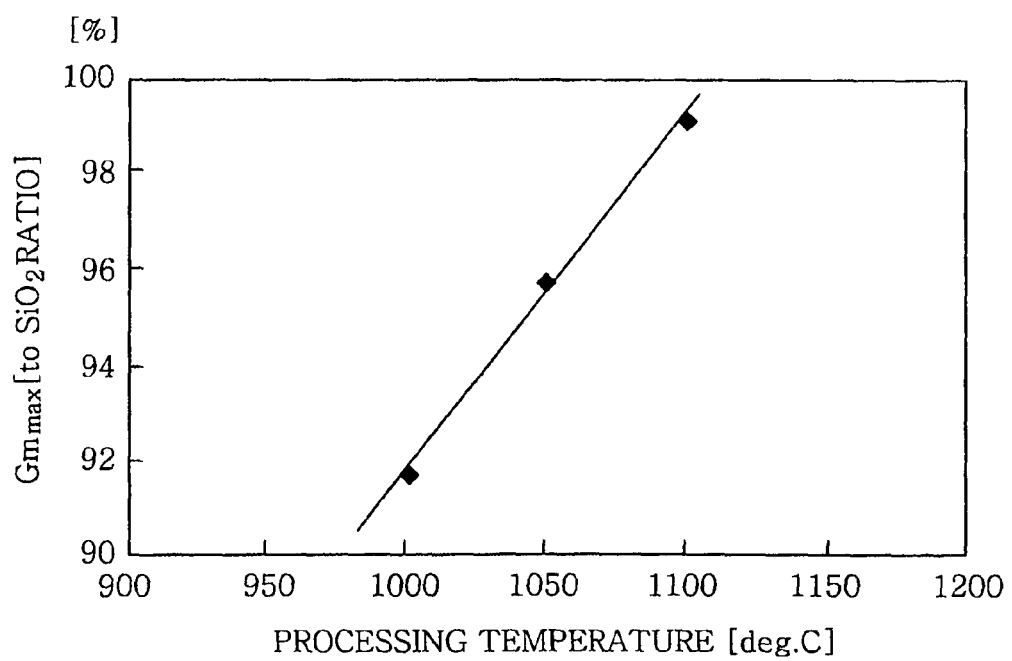
FIG. 13 provides a graph describing a relationship between $Gm_{max}$ and a temperature of a thermal oxidation process.
Figure 14:
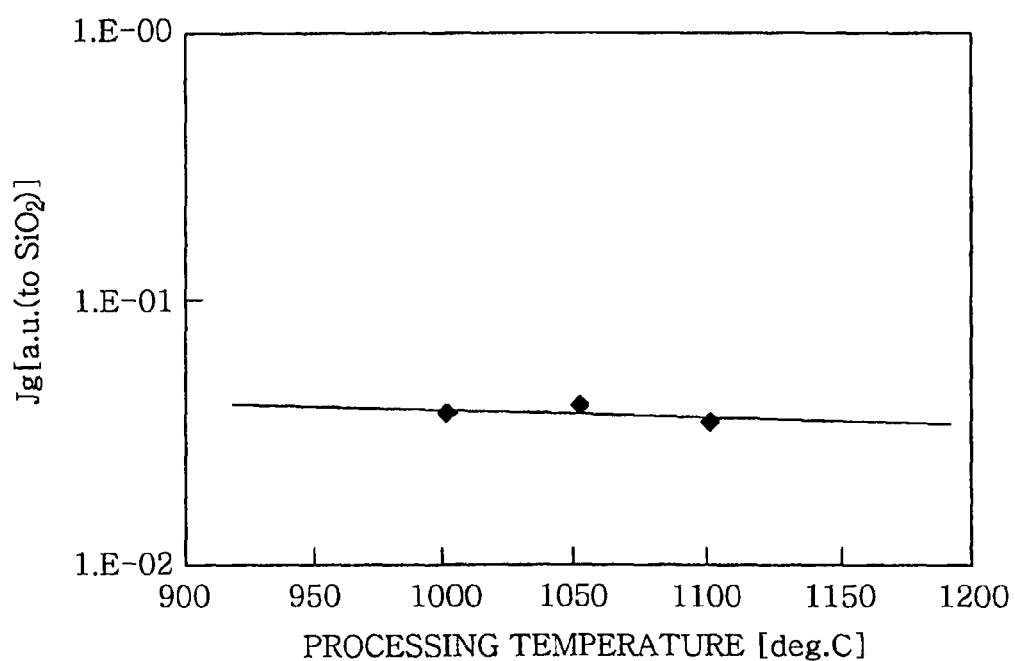
FIG. 14 presents a graph showing a relationship between Jg and a temperature in a thermal oxidation process.

FIG. 13 represents a relationship between $Gm_{max}$ and a processing temperature, and FIG. 14 represents a relationship between Jg and a processing temperature. Further, the vertical axis shown in FIG. 13 indicates a percentage when setting as 100% $Gm_{max}$ of the NMOS transistor using a silicon oxide film ($SiO_2$ film) as a gate insulating film. Moreover, the vertical axis shown in FIG. 14 indicates a normalized Jg of the NMOS transistor using a silicon oxide film ($SiO_2$ film) as a gate insulating film. The horizontal axes shown in FIGS. 13 and 14 represent the temperature of the thermal oxidation process.

From FIG. 13, it can be (found that $Gm_{max}$ increased as the processing temperature of the thermal oxidation using $N_2O$ increased. This is considered because, as the processing temperature increased, the amount of oxygen reaching the interface between the silicon oxynitride film and the silicon layer increased and the fixed charges at the interface were reduced. Moreover, from FIG. 14, it can be found that Jg was substantially constant regardless of the processing temperature of the thermal oxidation process. Therefore, it is clear that the thermal oxidation process (annealing) of the step S2 is preferably performed at a high temperature higher than or equal to about 1000° C., e.g., in a range from about 1000 to 1200° C., and more preferably at a temperature higher than or equal to about 1050° C.

Next, the effects of the processing pressure of the nitriding process in the step S3 for nitriding the surface side of the silicon oxynitride film (SiON film) to the profile of atoms in the film were examined by the following method.

Above all, a surface of single crystalline silicon of a wafer W was processed by a 1% dilute hydrofluoric acid (DHF) and, then, a plasma nitriding process was performed by using the plasma processing apparatus 100 having a configuration shown in FIG. 5. Accordingly, a silicon nitride film (SiN film) was formed on the silicon surface. The plasma nitriding process was performed under the following conditions: a processing gas having a mixture of Ar and $N_2$ respectively having flow rates of about $1000/40$ mL/min(sccm); a wafer temperature set at about 400° C.; a processing pressure of about 199.9 Pa (about 1500 mTorr); and a microwave power of about 1.5 kW.

Next, the wafer W having the silicon nitride film (SiN film) was thermally oxidized by using the heat treatment apparatus 101 having a configuration shown in FIG. 9, thereby forming a silicon oxynitride film (SiON film). The thermal oxidation was carried out under the following conditions: a processing pressure of about 213 Pa (1600 mTorr); a processing gas having a mixture of $N_2$ and $N_2O$ respectively having flow rates of about $1700/300$ mL/min(sccm); a processing temperature of about 1100° C.; and processing time of about 30 seconds.

Thereafter, the surface side of the silicon oxynitride film was mainly subjected to plasma nitriding by using the plasma processing apparatus 100 having a configuration shown in FIG. 5. The plasma nitriding process was performed under the following conditions: a processing gas having a mixture of Ar and $N_2$ respectively having flow rates of about $1000/40$ mL/min (sccm); a wafer temperature set at about 400° C.; varied processing pressures of about 6.7 Pa (50 mTorr), 19.9 Pa (150 mTorr), 45.0 Pa (338 mTorr) or 66.7 Pa (500 mTorr); and a microwave power ranging from 1.0 to 1.5 kW.

Figure 16A:
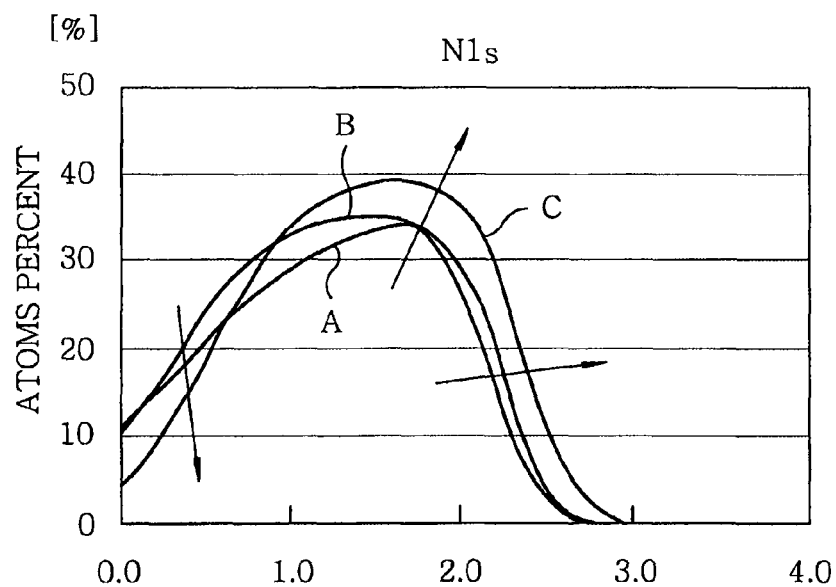
FIG. 16A offers a graph showing a nitrogen atom concentration profile in a film depth direction in accordance with silicon oxynitride film forming conditions.
Figure 16B:
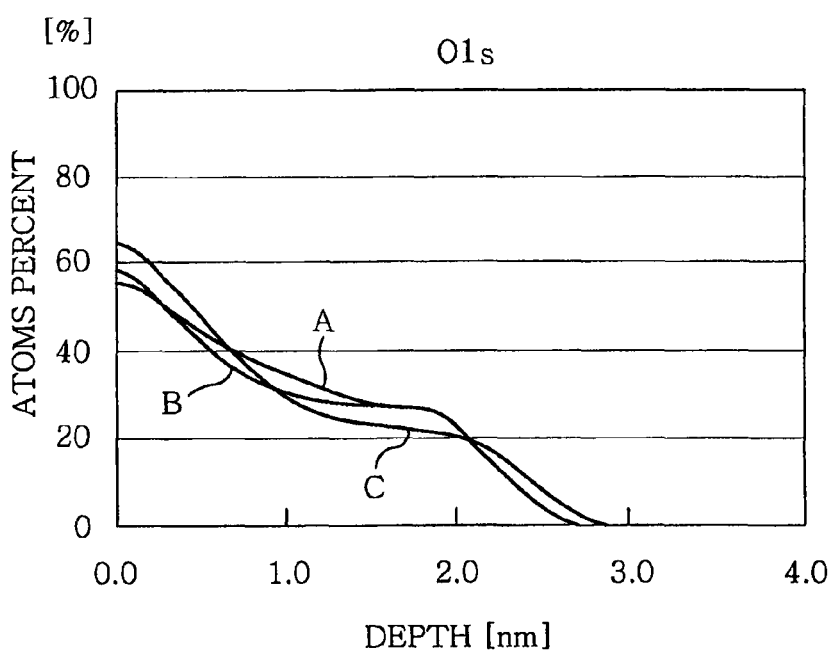
FIG. 16B is a graph showing an oxygen atom concentration profile in a film depth direction in accordance with silicon oxynitride film forming conditions.
Figure 16C:
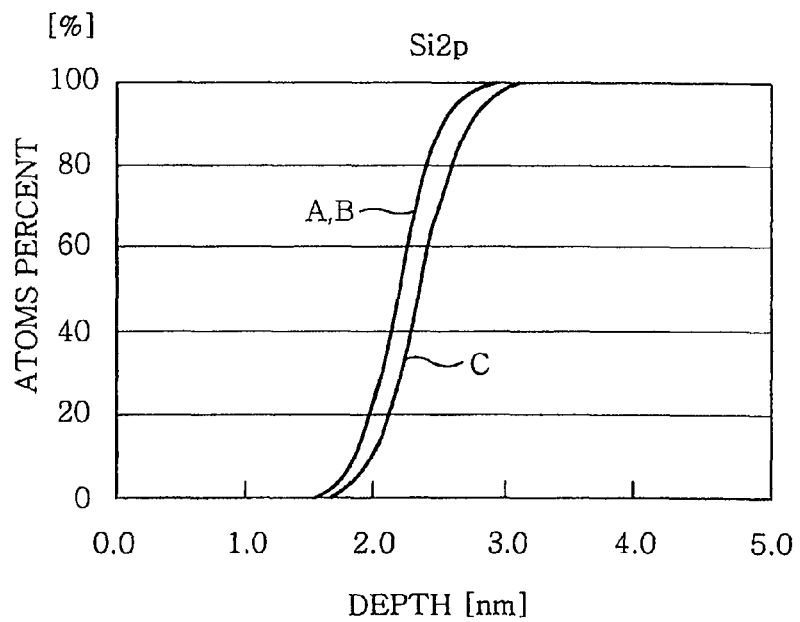
FIG. 16C sets forth a graph showing a silicon atom concentration profile in a film depth direction in accordance with silicon oxynitride film forming conditions.

FIG. 15 shows a relationship between a film thickness and an N concentration in a film in an XPS analysis. A notation of "non-step3" in FIG. 15 indicates a case where the steps S1 and S2 of FIG. 1 were performed without performing the step S3. Besides, FIGS. 16A to 16C illustrate profiles of nitrogen atoms (N1s), oxygen atoms (O1s) and silicon atoms (Si2P) in the film. In FIGS. 16A to 16C, a curve A indicates a case where the processes up to the step S2 were performed without performing the processes thereafter; a curve B indicates a case where the second nitriding process of the step S3 was performed at about 6.7 Pa (50 mTorr); and a curve C represents a case where the second nitriding process of the step S3 was performed at about 66.7 Pa (500 mTorr).

From FIG. 15, it is clear that, when the nitriding process of the step S3 was performed at a low pressure (e.g., about 6.7 Pa), compared to when it was performed at a relatively high pressure (e.g., about 66.7 Pa), the nitrogen concentration was higher at the same film thickness and, hence, a film growth was suppressed. Further, from FIGS. 16A to 16C, it is clear that, when the nitriding process of the step S3 was performed at a low pressure (e.g., about 6.7 Pa), it was possible to increase the nitrogen concentration near the surface of the silicon oxynitride film. Accordingly, it is expected to reliably prevent a leakage current of a transistor having a silicon oxynitride film as a gate insulating film. That is, it is preferable to perform the nitriding process of the step S3 at a pressure between about 0.133 and 66.7 Pa.

Thereafter, there were examined the effects of performance/non-performance of the annealing process of the step S4 and conditions of the corresponding annealing process to the electrical characteristics of the transistor. By processing the wafer W under the following condition, an insulating film (silicon oxynitride film) was formed. Next, a transistor having the insulating film as a gate insulating film was fabricated, and the electrical characteristics thereof were examined.

<Pre-Treatment>

The treatment using 1% dilute hydrofluoric acid (DHF) was performed on a surface of single crystalline silicon of a wafer W for about 45 seconds.

<Nitriding Process 1 (Step S1)>

The plasma nitriding process (first plasma nitriding process) was performed by using the plasma processing apparatus 100 having a configuration shown in FIG. 5 under the following conditions: a processing gas having a mixture of Ar and $N_2$ respectively having flow rates of about $1000/200$ mL/min (sccm); a wafer temperature controlled at about 600° C.; a processing pressure of about 199.9 Pa (1500 mTorr); and a microwave power of about 1.5 kW.

<Oxidation Process A1 (Step S2)>

The thermal oxidation process (first annealing process ($N_2O$)) was performed by using the heat treatment apparatus 101 having a configuration shown in FIG. 9 under the following conditions: a processing gas of $N_2O$ having a flow rate of about 2000 mL/min (sccm); a processing temperature controlled at about 1100° C.; and processing time of about 23 seconds.

<Oxidation Process A2 (Step S2)>

The thermal oxidation process (first annealing process ($O_2$)) was performed by using the heat treatment apparatus 101 having a configuration shown in FIG. 9 under the following conditions: a processing gas of $O_2$ having a flow rate of about 2000 mL/min (sccm); a processing pressure of about 9997.5 Pa (75 Torr); a processing temperature controlled at about 1100° C.; and processing time of about 9 seconds.

<Nitriding Process 2 (Step S3)>

The plasma nitriding process (second plasma nitriding process) was performed mainly on the surface side of the silicon oxynitride film by using the plasma processing apparatus 100 having a configuration shown in FIG. 5 under the following conditions: a processing gas having a mixture of Ar and $N_2$ respectively having flow rates of about $1000/40$ mL/min (sccm); a wafer temperature controlled at about 600° C.; a processing pressure of about 12 Pa (90 mTorr); a microwave power of about 1.5 kW; and processing time of about 23 seconds.

<Annealing Process A1 (Step S4)>

The annealing process (second annealing process) was performed by using the heat treatment apparatus 101 having a configuration shown in FIG. 9 under the following conditions: a processing gas of $N_2$ having a flow rate of about 2000 mL/min (sccm); a processing pressure of about 133.3 Pa (1 Torr); a processing temperature controlled at about 800° C.; and processing time of about 30 seconds.

<Annealing Process A2 (Step S4)>

The annealing process (second annealing process) was performed by using the heat treatment apparatus 101 having a configuration shown in FIG. 9 under the following conditions: a processing gas of $N_2$ having a flow rate of about 2000 mL/min (sccm); a processing pressure of about 133.3 Pa (1 Torr); a processing temperature controlled at about 1000° C.; and processing time of about 30 seconds.

<Annealing Process A3 (Step S4)>

The annealing process (second annealing process) was performed by using the heat treatment apparatus 101 having a configuration shown in FIG. 9 under the following conditions: a processing gas having a mixture of $O_2$ and $N_2$ respectively having flow rates of about $100/1900$ mL/min (sccm); a processing pressure of about 133.3 Pa (1 Torr); a processing temperature controlled at about 1100° C.; and processing time of about 30 seconds.

Test 1:

The processes were performed in the order of the pre-treatment, the nitriding process 1 (first plasma nitriding process) and the oxidation process A2 (first annealing process) (without performing the processes after the step S2).

Test 2:

The processes were performed in the order of the pre-treatment, the nitriding process 1 (first plasma nitriding process) and the oxidation process A1 (first annealing process) (without performing the processes after the step S2).

Test 3:

The processes were performed in the order of the pre-treatment, the nitriding process 1 (first plasma nitriding process), the oxidation process A1 (first annealing process) and the nitriding process 2 (second plasma nitriding process) (without performing the step S4).

Test 4:

The processes were performed in the order of the pre-treatment, the nitriding process 1 (first plasma nitriding process), the oxidation process A1 (first annealing process), the nitriding process 2 (second plasma nitriding process) and the annealing process A1 (second annealing process).

Test 5:

The processes were performed in the order of the pre-treatment, the nitriding process 1 (first plasma nitriding process), the oxidation process A1 (first annealing process), the nitriding process 2 (second plasma nitriding process) and the annealing process A2 (second annealing process).

Test 6:

The processes were performed in the order of the pre-treatment, the nitriding process 1 (first plasma nitriding process), the oxidation process A1 (first annealing process), the nitriding process 2 (second plasma nitriding process) and the annealing process A3 (second annealing process).

Figure 17:
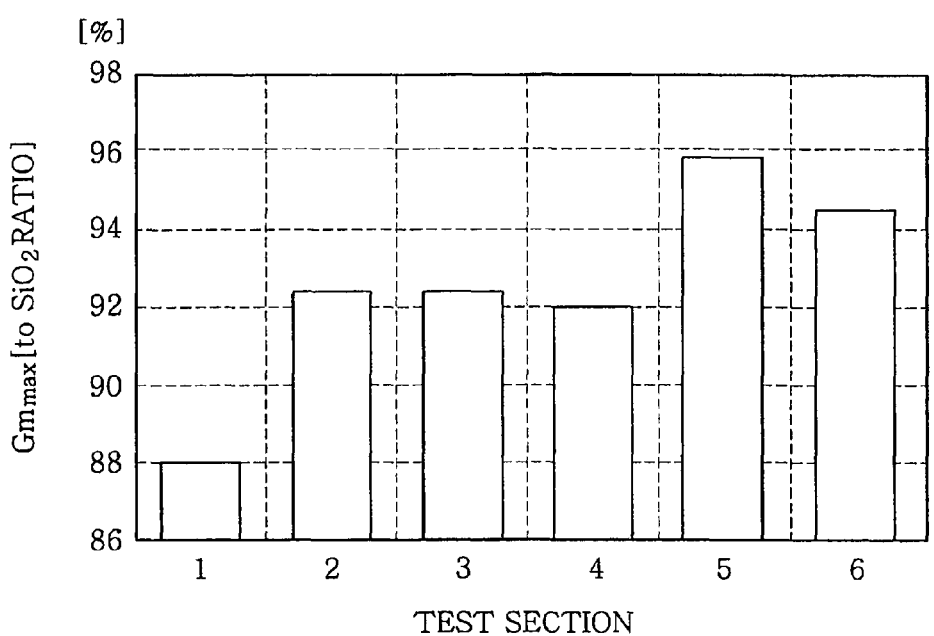
FIG. 17 provides a graph showing $Gm_{max}$ in various tests.
Figure 18:
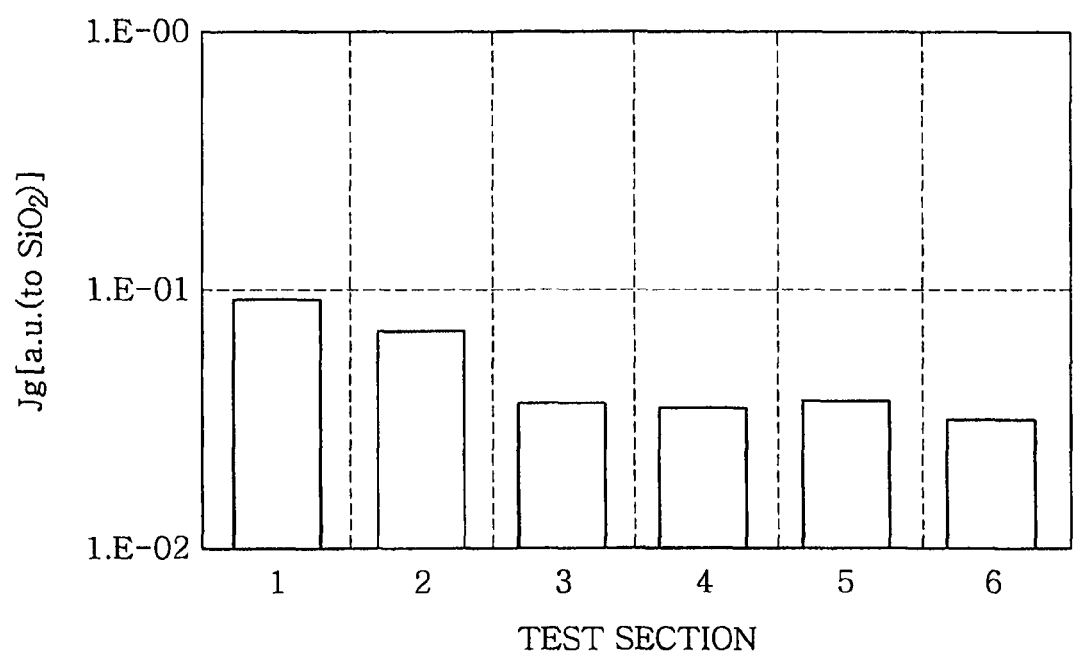
FIG. 18 depicts a graph illustrating Jg in various tests.

The measurement results of $Gm_{max}$ and Jg in the tests 1 to 6 are shown in FIGS. 17 and 18, respectively. Further, the vertical axis of FIG. 17 indicates a percentage when setting as 100% $Gm_{max}$ of the NMOS transistor using a silicon oxide film ($SiO_2$ film) as a gate insulating film. Moreover, the vertical axis of FIG. 18 indicates a normalized Jg of the NMOS transistor using a silicon oxide film ($SiO_2$ film) as a gate insulating film.

From FIG. 17, it is seen that when the tests 1 and 2 in which the processes after the step S3 were not performed were compared, $Gm_{max}$ was greatly increased in the test 2 in which the thermal oxidation process of the step S2 was performed by using $N_2O$, compared to that in the test 1 in which the thermal oxidation process of the step S2 was performed by using $O_2$. Further, $Gm_{max}$ in the test 2 was substantially the same as that in the test 3 in which the nitriding process of the step S3 was carried out.

Moreover, the test 3 in which the processes up to the nitriding process of the step S3 were performed was compared with the tests 4 to 6 in which the processes up to the annealing process of the step S4 were performed. In the test 4 in which the annealing process was performed in an $N_2$ atmosphere and at about 800° C., there was obtained $Gm_{max}$ substantially the same as that in the test 3 in which the annealing process was not executed, and an insulating film having good electrical characteristics was formed. Further, in the tests 5 and 6 in which the annealing process of the step S4 was performed at a temperature higher than or equal to 1000° C., $Gm_{max}$ was greatly improved regardless of types of purge gases, and an insulating film having better electrical characteristics was formed.

From FIG. 18, it is seen that Jg was decreased and, thus, a leakage current was suppressed in the test 3 in which the processes were performed up to the nitriding process of the step S3 and the tests 4 to 6 in which the processes were performed up to the annealing process of the step S4, compared to those in the tests 1 and 2 in which the processes after the step S2 were not performed. Therefore, it is possible to form an insulating film having good electrical characteristics. Further, in the annealing process of the step S4, the flow rate ratio of $O_2/N_2$ is preferably in a range from about 0 to 0.01. It is more preferable to perform the annealing process in an 100% $N_2$ gas atmosphere.

Further, the present invention is not limited to the above embodiments, and may be variously modified within the scope of the present invention.

For example, in the above embodiments, the RLSA plasma processing apparatus 100 is used in the first nitriding process (step S1). However, in the first nitriding process, it is also possible to use another plasma processing apparatus, e.g., a remote plasma processing apparatus, an ICP (Inductively Coupled Plasma) plasma processing apparatus, an ECR (Electron Cyclotron Resonance) plasma processing apparatus, a surface reflected wave plasma processing apparatus, a CP (Capacitive-Coupling Plasma) plasma processing apparatus, a magnetron plasma processing apparatus or the like, or a plasma processing apparatus having a plate of which configuration is the same as that of the plate 60.

INDUSTRIAL APPLICABILITY

The present invention can be appropriately used to form a silicon nitride film by nitriding silicon in a manufacturing process of various semiconductor devices.

What is claimed is:

1. A method for forming an insulating film comprising:
forming a silicon nitride film by performing a plasma silicon nitriding on a silicon surface exposed on a target substrate, said plasma silicon nitriding occurring by introducing nitrogen directly into the silicon surface from a plasma of a rare gas and a nitrogen containing gas; and
forming a silicon oxynitride film by performing a heat treatment of the silicon nitride film in an $N_2O$ atmosphere,
wherein the heat treatment is performed at a processing pressure ranging from 133.3 to 1333 Pa and a processing temperature ranging from 900 to 1200° C.

2. The method of claim 1, wherein the plasma silicon nitriding is performed by introducing microwaves into a processing chamber by a planar antenna having a plurality of slots.

3. The method of claim 1, wherein a film thickness of the silicon nitride film formed by the silicon nitriding ranges from 0.5 to 1 nm.

4. The method of claim 1, wherein the heat treatment in an $N_2O$ atmosphere is performed in a mixed atmosphere of $N_2O$ and $N_2$, or in an $N_2O$ gas atmosphere.

5. The method of claim 1, wherein the processing temperature in the heat treatment in an $N_2O$ atmosphere is in a range from 1000 to 1200° C.

6. A method for forming an insulating film comprising:
forming a silicon nitride film by performing a silicon nitriding on a silicon surface exposed on a target substrate by using a plasma of a rare gas and a nitrogen containing gas;
forming a silicon oxynitride film by performing a heat treatment on the target substrate provided with the silicon nitride film in an $N_2O$ atmosphere; and
performing a nitriding of the silicon oxynitride film by using a plasma mainly including ions,
wherein the heat treatment is performed at a processing pressure ranging from 133.3 to 1333 Pa and a processing temperature ranging from 900 to 1200° C.

7. The method of claim 6, wherein the silicon nitriding is performed by using a nitrogen containing plasma formed by introducing microwaves into a processing chamber by a planar antenna having a plurality of slots.

8. The method for forming an insulating film of claim 6, wherein a film thickness of the silicon nitride film formed by the silicon nitriding ranges from 0.5 to 1 nm.

9. The method of claim 6, wherein the heat treatment in an $N_2O$ atmosphere is performed in a mixed atmosphere of $N_2O$ and $N_2$, or in an $N_2O$ gas atmosphere.

10. The method for forming an insulating film of claim 6, wherein the processing temperature in the heat treatment in an $N_2O$ atmosphere is in a range from 1000 to 1200° C.

11. A method for forming an insulating film comprising:
forming a silicon nitride film by performing a silicon nitriding on a silicon surface exposed on a target substrate by using a plasma of a rare gas and a nitrogen containing gas;
forming a silicon oxynitride film by performing a first heat treatment on the target substrate provided with the silicon nitride film in an $N_2O$ atmosphere;
performing a nitriding of the silicon oxynitride film by using a plasma mainly including ions; and
performing a second heat treatment on the target substrate after performing the nitriding of the silicon oxynitride film,
wherein the first heat treatment is performed at a processing pressure ranging from 133.3 to 1333 Pa and a processing temperature ranging from 900 to 1200° C. and the second heat treatment is performed at a processing pressure ranging from 133.3 to 1333 Pa and a processing temperature ranging from 800 to 1200° C.

12. The method for forming an insulating film of claim 11, wherein the silicon nitriding is performed by using a nitrogen containing plasma formed by introducing microwaves into a processing chamber by a planar antenna having a plurality of slots.

13. The method of claim 11, wherein a film thickness of the silicon nitride film formed by the silicon nitriding ranges from 0.5 to 1 nm.

14. The method of claim 11, wherein the first heat treatment-is performed in a mixed atmosphere of $N_2O$ and $N_2$, or in an $N_2O$ gas only atmosphere.

15. The method of claim 11, wherein the processing temperature in the first heat treatment is in a range from 1000 to 1200° C.

16. The method of claim 11, wherein the second heat treatment is performed in an $N_2$ gas atmosphere, an $O_2$ gas atmosphere, or in a mixed atmosphere of $N_2$ and $O_2$.

17. The method of claim 16, wherein in the second heat treatment, a flow rate ratio of $O_2/N_2$ is in a range from 0 to 0.01.

18. A method for manufacturing a semiconductor device comprising:
forming a gate insulating film on a silicon substrate; and
forming a gate electrode on the gate insulating film,
wherein the gate insulating film is formed by a method including:
forming a silicon nitride film by performing a plasma silicon nitriding on a silicon surface exposed on the silicon substrate, said plasma silicon nitriding occurring by introducing nitrogen directly into the silicon surface from a plasma of a rare gas and a nitrogen containing gas; and forming a silicon oxynitride film by performing a heat treatment of the silicon nitride film in an $N_2O$ atmosphere, wherein the heat treatment is performed at a processing pressure ranging from 133.3 to 1333 Pa and a processing temperature ranging from 900 to 1200° C.

19. A method for manufacturing a semiconductor device comprising:

forming a gate insulating film on a silicon substrate; and forming a gate electrode on the gate insulating film, wherein the gate insulating film is formed by a method including:

forming a silicon nitride film by performing a silicon nitriding on a silicon surface exposed on the silicon substrate by using a plasma of a rare gas and a nitrogen containing gas;

forming a silicon oxynitride film by performing a heat treatment on the target substrate provided with the silicon nitride film in an $N_2O$ atmosphere; and performing a nitriding of the silicon oxynitride film by using a plasma mainly including ions, wherein the heat treatment is performed at a processing pressure ranging from 133.3 to 1333 Pa and a processing temperature ranging from 900 to 1200° C.

20. A method for manufacturing a semiconductor device comprising:

forming a gate insulating film on a silicon substrate; and forming a gate electrode on the gate insulating film, wherein the gate insulating film is formed by a method including:

forming a silicon nitride film by performing a silicon nitriding on a silicon surface exposed on the silicon substrate by using a plasma of a rare gas and a nitrogen containing gas;

forming a silicon oxynitride film by performing a first heat treatment on the silicon substrate provided with the silicon nitride film in an $N_2O$ atmosphere;

performing a nitriding of the silicon oxynitride film by using a plasma mainly including ions; and performing a second heat treatment on the silicon substrate after performing the nitriding of the silicon oxynitride film, wherein the first heat treatment is performed at a processing pressure ranging from 133.3 to 1333 Pa and a processing temperature ranging from 900 to 1200° C. and the second heat treatment is performed at a processing pressure ranging from 133.3 to 1333 Pa and a processing temperature ranging from 800 to 1200° C.

* * * * *